(12) United States Patent
Shimanuki

(10) Patent No.: US 7,470,567 B2
(45) Date of Patent: Dec. 30, 2008

(54) SEMICONDUCTOR DEVICE AND METHOD OF MANUFACTURING THE SAME

(75) Inventor: Yoshihiko Shimanuki, Nanae (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/078,587

(22) Filed: Apr. 2, 2008

(65) Prior Publication Data
US 2008/0194060 A1 Aug. 14, 2008

Related U.S. Application Data

(63) Continuation of application No. 11/734,996, filed on Apr. 13, 2007, now Pat. No. 7,371,613.

(30) Foreign Application Priority Data

May 16, 2006 (JP) ............................. 2006-135999

(51) Int. Cl.
*H01L 21/44* (2006.01)
(52) U.S. Cl. ...................... 438/113; 438/114; 438/462; 257/E21.499
(58) Field of Classification Search ......... 438/110–114, 438/460, 462; 257/E21.499
See application file for complete search history.

(56) References Cited

U.S. PATENT DOCUMENTS 6,649,448 B2 * 11/2003 Tomihara .................. 438/113
7,033,857 B2 4/2006 Munakata et al.

2007/0216038 A1 9/2007 Park et al.

FOREIGN PATENT DOCUMENTS

JP 2004-55860 2/2004

* cited by examiner

*Primary Examiner*—Thanhha Pham
(74) *Attorney, Agent, or Firm*—Mattingly, Stanger, Malur & Brundidge, PC

(57) ABSTRACT

A semiconductor device manufacturing method capable of improving the semiconductor device manufacturing yield is disclosed. Semiconductor chips are mounted respectively over semiconductor device regions of a matrix wiring substrate having plural semiconductor device regions, followed by wire bonding, and thereafter sealing resin is formed at a time onto the semiconductor device regions. Thereafter, target marks for dicing are formed on an upper surface of the sealing resin on the basis of target marks pre-formed on an upper surface of the wiring substrate. Then, half-dicing is performed from the upper surface side of the sealing resin 5a on the basis of the target marks for dicing to form grooves whose bottoms reach the wiring substrate. Subsequently, solder balls are connected to a lower surface of the wiring substrate and dicing is performed from a lower surface side of the wiring substrate for division into individual semiconductor devices.

2 Claims, 24 Drawing Sheets

FIG. 13
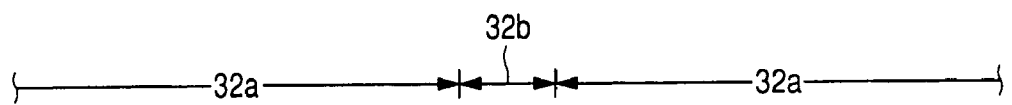
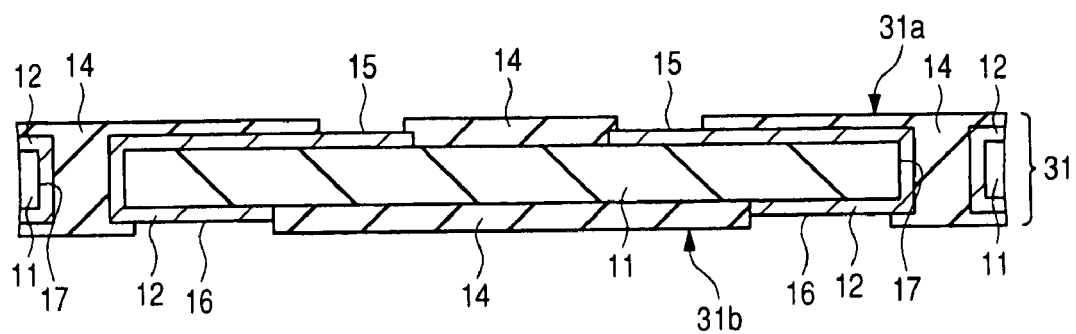
FIG. 14
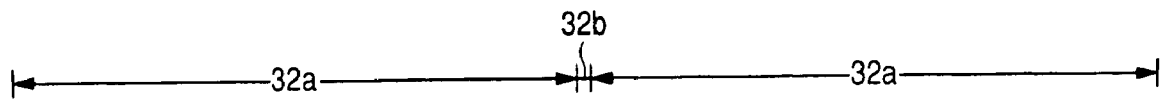
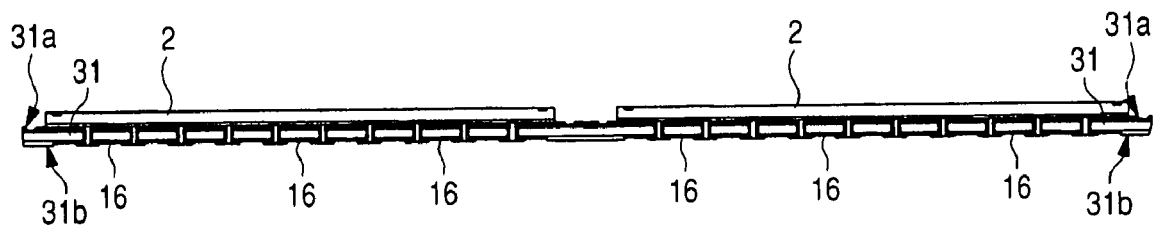

FIG. 35
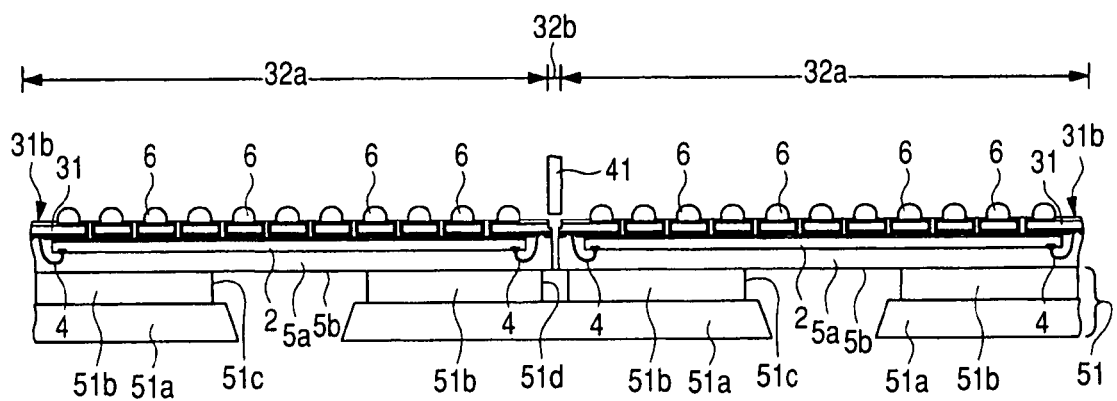
FIG. 36
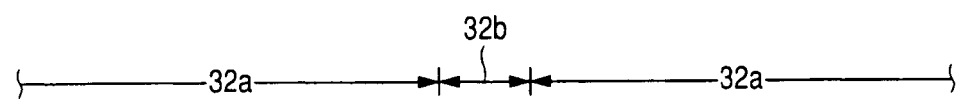
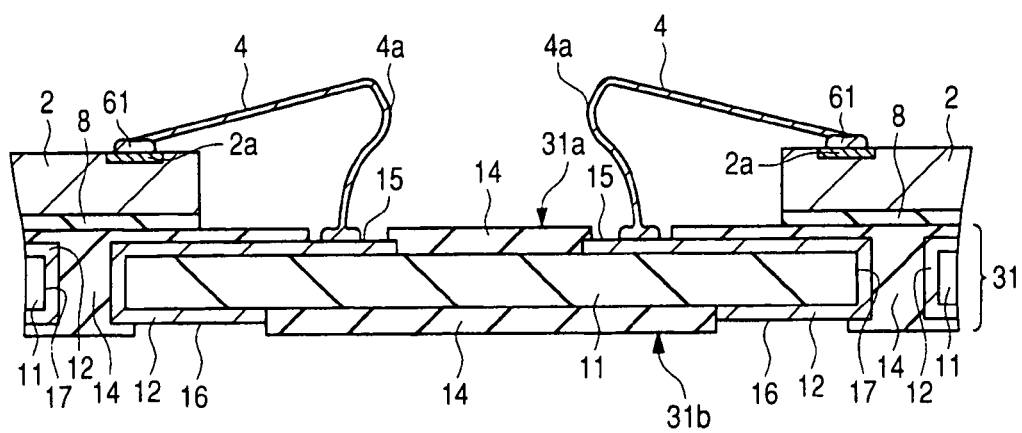

SEMICONDUCTOR DEVICE AND METHOD OF MANUFACTURING THE SAME

CROSS-REFERENCE

This is a continuation application of U.S. Ser. No. 11/734,996, filed Apr. 13, 2007 now U.S. Pat. No. 7,371,613.

CROSS-REFERENCE TO RELATED APPLICATIONS

The disclosure of Japanese Patent Application No. 2006-135999 filed on May 16, 2006 including the specification, drawings and abstract is incorporated herein by reference in its entirety.

BACKGROUND OF THE INVENTION

The present invention relates to a semiconductor device and a method of manufacturing the same. Particularly, the present invention is concerned with a technique applicable effectively to a semiconductor device of a semiconductor package type with a semiconductor chip mounted on a wiring substrate, as well as a method of manufacturing the semiconductor device.

A semiconductor device of a semiconductor package type is manufactured by mounting a semiconductor chip onto a wiring substrate, then connecting electrodes of the semiconductor chip and connecting terminals of the wiring substrate with each other electrically through bonding wires, sealing the semiconductor chip and the bonding wires with resin and connecting solder balls to a back surface of the wiring substrate. As such a semiconductor device there is known a semiconductor package of the chip size called CSP (Chip Size Package) or a small-sized semiconductor package a little larger than the semiconductor chip.

In Japanese Unexamined Patent Publication No. 2004-55860 there is described a technique of providing a matrix substrate having plural device regions formed on a main surface thereof, fixing semiconductor chips to the device regions respectively, thereafter sealing the semiconductor chips all together with resin to form a block molding portion, and dividing the block molding portion and the matrix substrate device region by device region by dicing.

SUMMARY OF THE INVENTION

Having made studies, the present inventors found out the following.

A semiconductor device can be manufactured by providing a matrix wiring substrate having plural device regions formed on a main surface thereof, fixing semiconductor chips to the device regions respectively, thereafter sealing the semiconductor chips all together with resin to form a block molding portion, and dividing the block molding portion and the matrix wiring substrate device region by device region by dicing.

In case of forming external terminals such as solder balls to the semiconductor devices, it is not easy to connect solder balls to each of diced semiconductor devices, resulting in that the throughput of semiconductor devices is deteriorated. Therefore, it is necessary that solder balls be connected to a matrix wiring substrate to form external terminals prior to dicing into individual pieces.

One method may be connecting solder balls to a lower surface of a matrix wiring substrate after forming a block molding portion and then dicing the block molding portion and the wiring substrate into individual pieces. In this case, since dicing is performed in a connected state of solder balls to the lower surface of the matrix wiring substrate, an attempt to fix the lower surface side of the wiring substrate is not effected to a satisfactory extent because the presence of the solder balls is an obstacle. Therefore, an upper surface side of the block molding portion is fixed and in this state the wiring board and the block molding portion are cut from the lower surface side of the matrix wiring substrate.

When dicing the lower surface side of the wiring substrate, the dicing can be carried out on the basis of target marks formed on the lower surface of the wiring substrate. However, the target marks on the lower surface of the wiring substrate are formed using patterns of a conductor layer or a solder resist layer on the lower surface side of the wiring substrate. Therefore, there can be attained a high relative positional accuracy of the target marks with respect to the patterns formed on the lower surface side of the wiring substrate, but a displacement is apt to occur for the patterns formed on the upper surface side of the same substrate. Consequently, a relative positional accuracy of the target marks formed on the lower surface of the wiring substrate with respect to the patterns (e.g., bonding wire connecting terminals) formed on the upper surface side of the same substrate is apt to become lower. For example, this is because conductor patterns are formed on the upper and lower surfaces of the wiring substrate through different exposure steps using different photomasks and therefore a relative positional accuracy between the conductor patterns on the upper surface of the wiring substrate and the conductor patterns on the lower surface of the same substrate is apt to become deteriorated.

Accordingly, if dicing is performed from the lower surface side of the wiring substrate on the basis of the target marks formed on the lower surface of the substrate, a relative positional accuracy of the dicing position with respect to the patterns on the upper surface of the wiring substrate, e.g., bonding wire connecting terminals, becomes deteriorated. If the dicing position is deviated, there is the possibility that connecting terminals and bonding wires may be exposed from cut faces of the block molding portion, namely, from side faces of the sealing resin in the semiconductor devices manufactured. The reason is that, particularly in the case of a CSP type semiconductor device, the planar size of a semiconductor chip and that of each semiconductor device formed by dicing are almost equal to each other and that therefore the distance from wire connecting terminals provided on the upper surface side of the wiring substrate to a cut face of the block molding portion is short. As a result, the semiconductor device manufacturing yield is deteriorated. Even if the dicing position is deviated, in order to prevent connecting terminals and bonding wires from being exposed from cut surfaces of the block molding portion, namely, from side faces of the sealing resin in each semiconductor device manufactured, it is necessary to set large the margin of each dicing region. However, this results in an increase in size of the semiconductor device.

It is an object of the present invention to provide a technique capable of improving the semiconductor device manufacturing yield.

Another object of the invention is to provide a technique capable of reducing the size of the semiconductor device.

The above and other objects and novel features of the present invention will become apparent from the following description and the accompanying drawings.

The following is an outline of typical modes of the present invention as disclosed herein.

In one aspect of the present invention there is provided a method of manufacturing a semiconductor device, comprising the steps of: (a) providing a wiring substrate having a plurality of unit substrate regions from which semiconductor devices are to be manufactured respectively, the wiring substrate having a first main surface and a second main surface located on the side opposite to the first main surface, with a plurality of first electrodes being formed over the first main surface of each of the unit substrate regions and a plurality of land portions formed over the second main surface of each of the unit substrate regions; (b) mounting semiconductor chips over the unit substrate regions respectively on the first main surface of the wiring substrate and coupling a plurality of second electrodes of the semiconductor chips electrically to the first electrodes of the wiring substrate; (c) forming sealing resin over the unit substrate regions on the first main surface of the wiring substrate so as to cover the semiconductor chips, thereby forming a sealing body comprising the wiring substrate and the sealing resin; (d) forming grooves in the sealing body from an upper surface side of the sealing resin along dicing regions each formed between adjacent ones of the unit substrate regions; (e) after the step (d), forming external connecting terminals over the land portions respectively in the unit substrate regions on the second main surface of the wiring substrate; and (f) after the step (e), cutting the sealing body from the second main surface side of the wiring substrate along the dicing regions between the unit substrate regions.

In a second aspect of the present invention there is provided a semiconductor device comprising: a wiring substrate having a first main surface, a second main surface located on the side opposite to the first main surface, a plurality of first electrodes formed over the first main surface, and a plurality of land portions formed over the second main surface; a semiconductor chip mounted over the first main surface of the wiring substrate, the semiconductor chip having a plurality of second electrodes coupled electrically to the first electrodes on the wiring substrate; sealing resin formed over the first main surface of the wiring substrate so as to cover the semiconductor chip; and a plurality of external connecting terminals formed over the land portions respectively on the second main surface of the wiring substrate, wherein a side face of the semiconductor device formed by both a side face of the sealing resin and a side face of the wiring substrate has a stepped portion such that a lower portion of the stepped portion is recessed with respect to an upper portion thereof.

The following is a brief description of effects obtained by the typical modes of the present invention as disclosed herein.

It is possible to improve the semiconductor device manufacturing yield.

It is possible to reduce the size of the semiconductor device.

BRIEF DESCRIPTION OF THE DRAWINGS

FIG. 13 is a sectional view of a principal portion in the manufacturing process of the semiconductor device like FIG. 12;

FIG. 14 is a sectional view in the manufacturing process of the semiconductor device which follows FIG. 12;

FIG. 35 is a sectional view of a principal portion in the manufacturing process of the semiconductor device according to another embodiment of the present invention;

FIG. 36 is a sectional view of a principal portion in a manufacturing process of a semiconductor device according to another embodiment of the present invention;

DETAILED DESCRIPTION OF PREFERRED EMBODIMENTS

Figure 1:
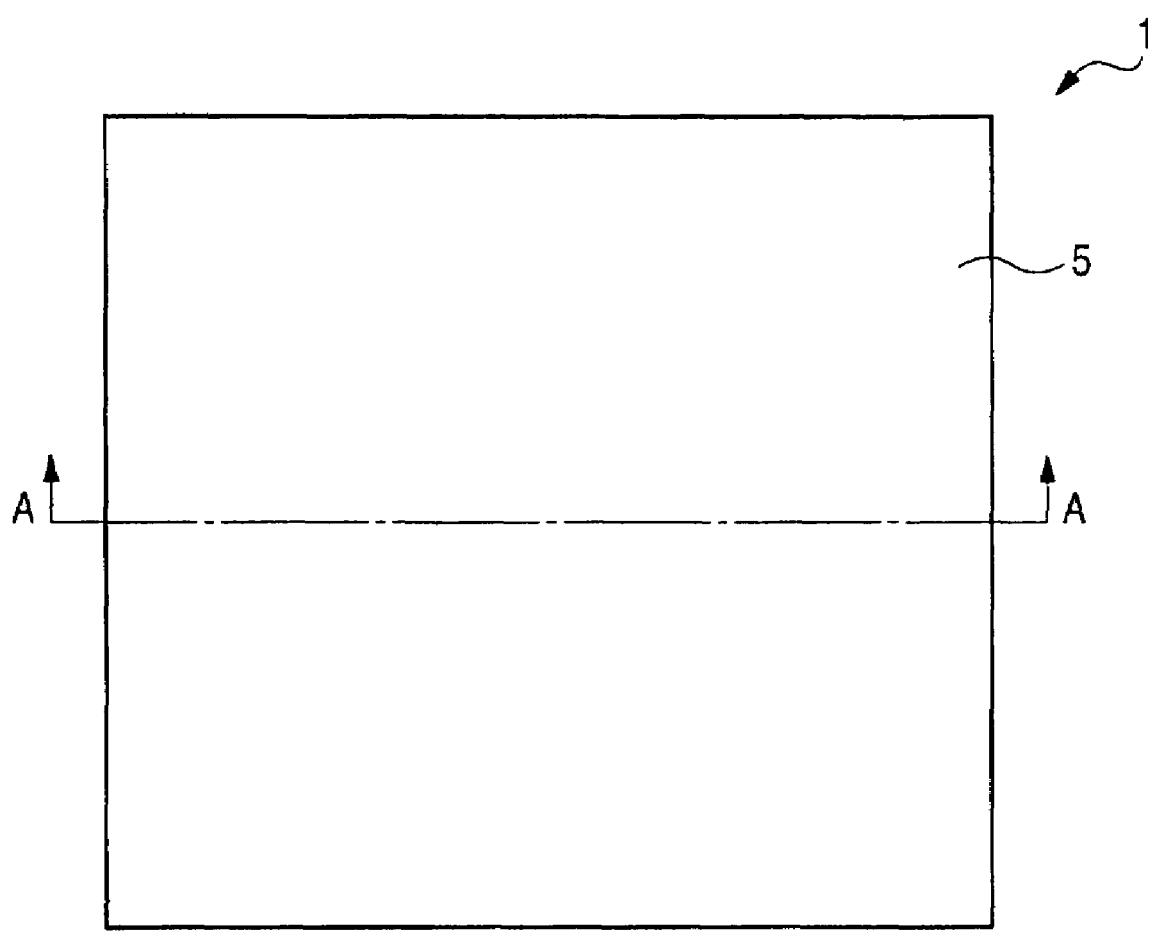
FIG. 1 is a top view of a semiconductor device according to an embodiment of the present invention.

Where required for convenience' sake, the following embodiments will each be described in a divided manner into plural sections or embodiments, but unless otherwise mentioned, they are not unrelated to each other but are in a relation such that one is a modification or a detailed or supplementary description of part or the whole of the other. In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to. Further, it goes without saying that in the following embodiments their constituent elements (including constituent steps) are not always essential unless otherwise mentioned and except the case where they are considered essential basically obviously. Likewise, it is to be understood that when reference is made to the shapes and positional relation of constituent elements in the following embodiments, those substantially closely similar to or resembling such shapes, etc. are also included unless otherwise mentioned and except the case where a negative answer is evident basically. This is also true of the foregoing numerical value and range.

Embodiments of the present invention will be described below with reference to the accompanying drawings. In all of the drawings for explaining the embodiments, members having the same functions are identified by the same reference numerals, and repeated explanations thereof will be omitted. In the following embodiments, explanations of the same or similar portions will not be repeated in principle except where such explanations are specially required.

In the drawings used in the following embodiments, hatching may be omitted even in a sectional view in order to make the drawing easier to see. Further, even a plan view may be hatched in order to make the drawing easier to see.

First Embodiment

A semiconductor device and a semiconductor device manufacturing method according to a first embodiment of the present invention will be described below with reference to drawings.

Figure 2:
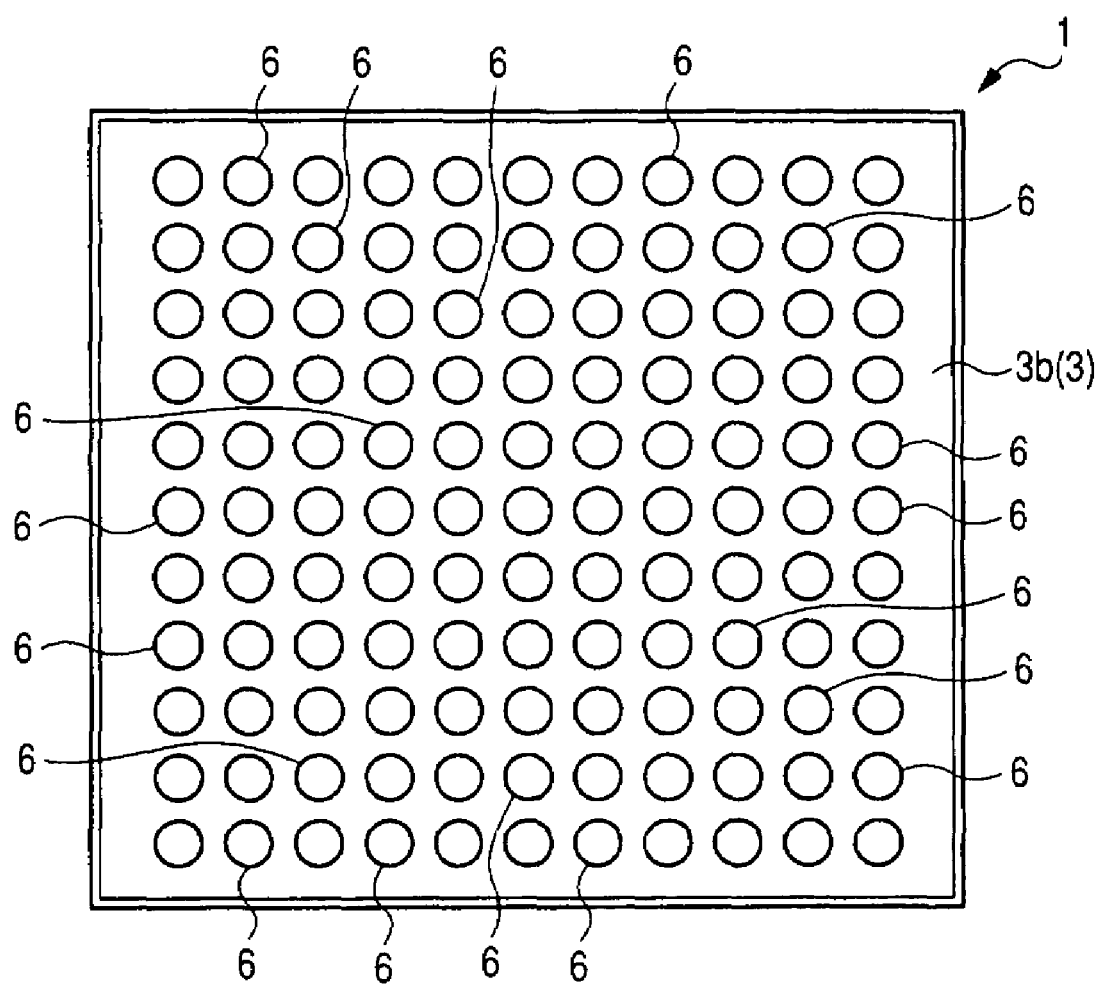
FIG. 2 is a bottom view of the semiconductor device.
Figure 3:
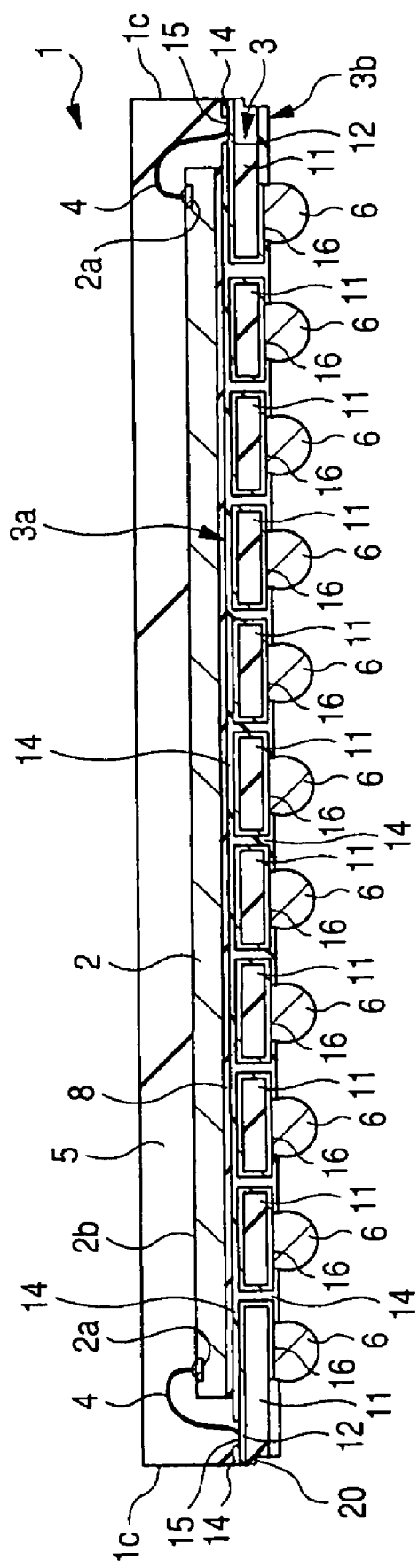
FIG. 3 is a sectional view of the semiconductor device.
Figure 4:
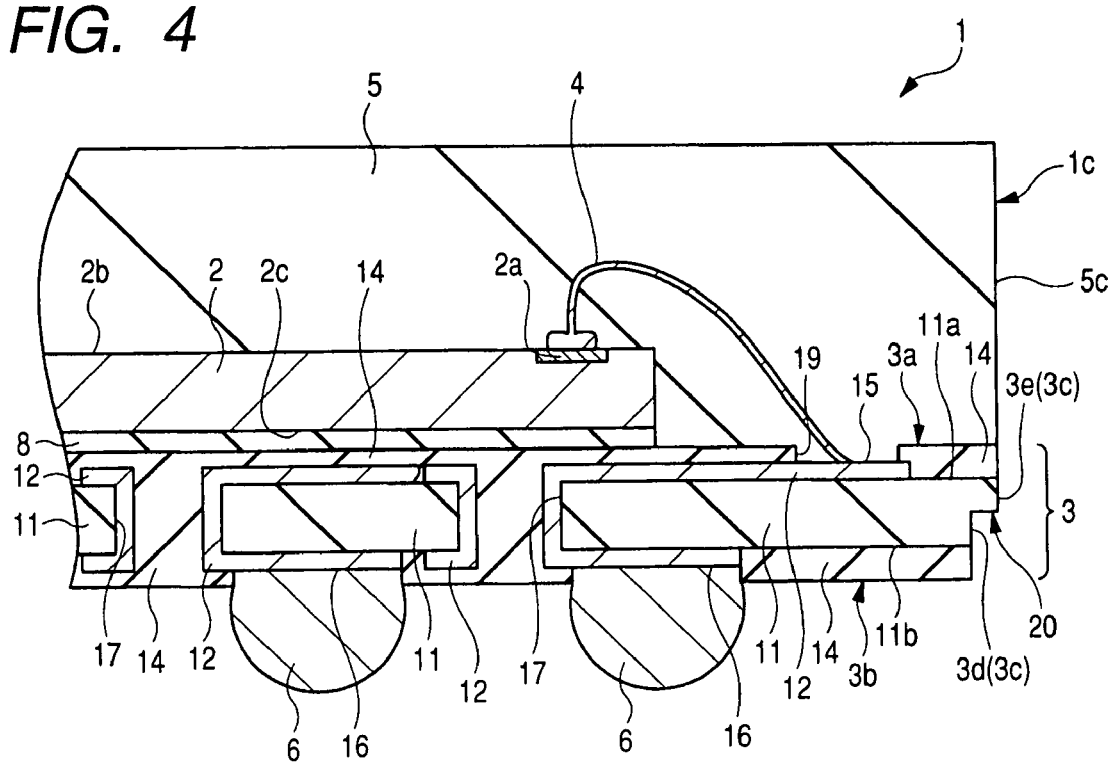
FIG. 4 is a sectional view of a principal portion of the semiconductor device.
Figure 5:
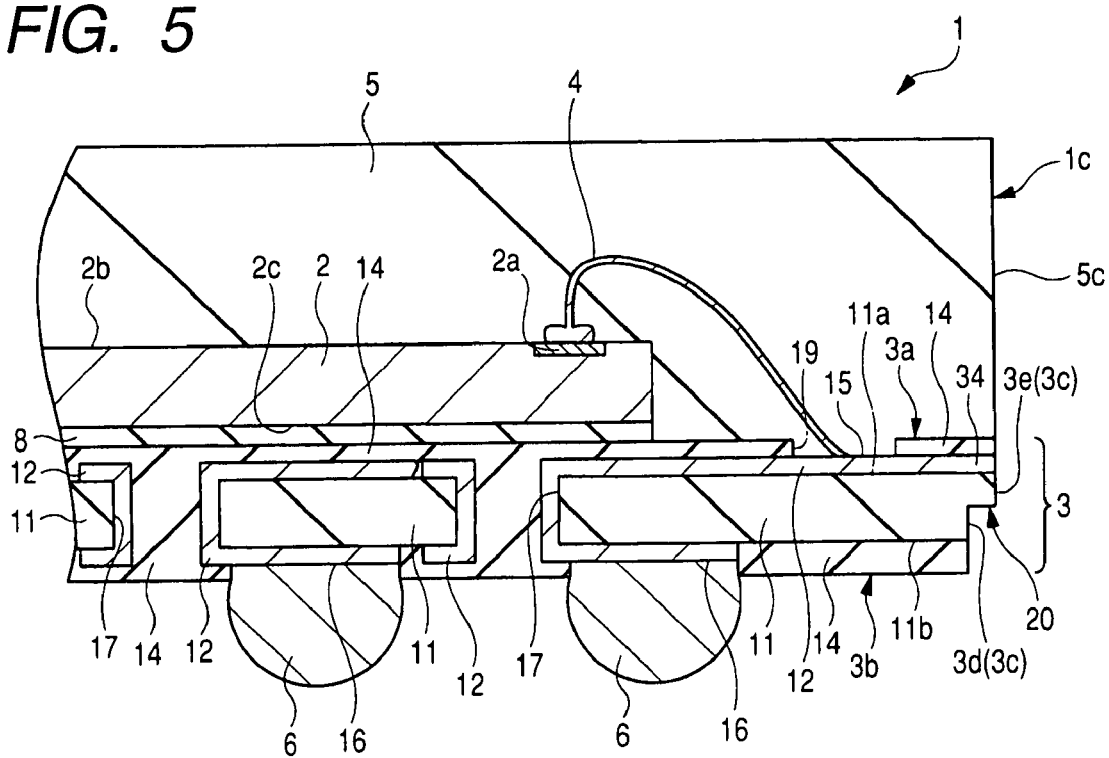
FIG. 5 is a sectional view of a principal portion of the semiconductor device.
Figure 6:
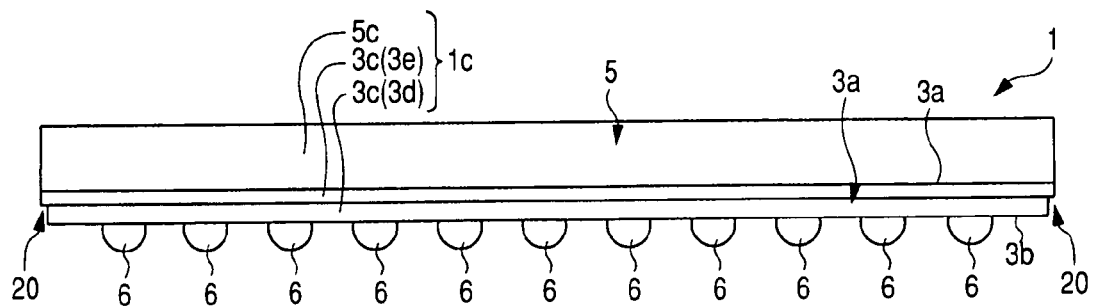
FIG. 6 is a side view of the semiconductor device.
Figure 7:
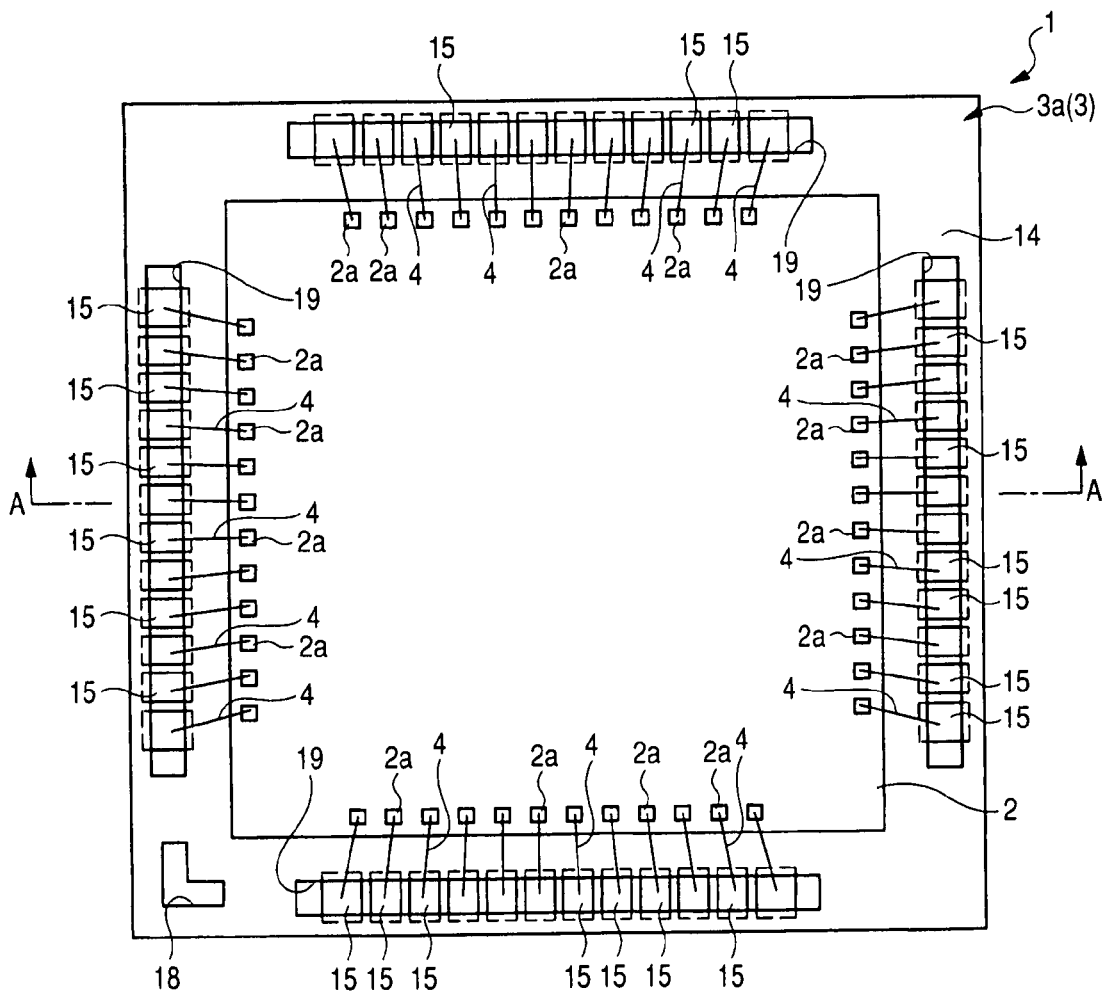
FIG. 7 is a perspective plan view of the semiconductor device.

FIG. 1 is a top view of a semiconductor device 1 according to this first embodiment, FIG. 2 is a bottom view thereof, FIG. 3 is a sectional view (entire sectional view) thereof, FIGS. 4 and 5 are sectional views (partial enlarged sectional views) of a principal portion thereof, and FIG. 6 is a side view thereof. FIG. 7 is a perspective plan view (top view) of the semiconductor device 1 as seen through sealing resin 5. Sections taken on line A-A in FIGS. 1 and 7 correspond substantially to FIG. 3 and enlarged views of the area near an end portion of FIG. 3 correspond substantially to FIGS. 4 and 5. FIG. 5 is a sectional view of a principal portion in an approximately the same positional area as in FIG. 4, but the section of FIG. 5 passes through a residual portion of a power supply lines (here a plating wire 34) for electrolytic plating in a wiring substrate 3, while the section of FIG. 4 does not pass through the power supply line (plating wire 4).

The semiconductor device 1 of this embodiment shown in FIGS. 1 to 7 is a semiconductor device (semiconductor package) with a semiconductor chip 2 mounted (joined, connected, packaged) on the wiring substrate 3. For example, it is a semiconductor device of a CSP (Chip Size Package) type which is a small-sized semiconductor package of the chip size or slightly larger than the semiconductor chip 2.

The semiconductor device 1 of this embodiment has the semiconductor chip 2, the wiring substrate 3 with the semiconductor chip 2 supported or mounted thereon, plural bonding wires 4 for electrically connecting plural electrodes 2a on a surface of the semiconductor chip 2 and corresponding plural connecting terminals 15 on the wiring substrate 3 with each other, sealing resin 5 which covers an upper surface 3a of the wiring substrate 3 including the semiconductor chip 2 and the bonding wires 4, and plural solder balls 6 disposed as external terminals in an area array fashion on a lower surface 3b of the wiring substrate 3.

The semiconductor chip 2 is square in its planar shape intersecting the thickness thereof. For example, the semiconductor chip 2 is fabricated by forming various semiconductor elements or semiconductor integrated circuits on a semiconductor substrate (semiconductor wafer) of a single crystal silicon for example, then subjecting the semiconductor substrate to back grinding if necessary, and thereafter cutting the semiconductor substrate into individual semiconductor chips 2 by dicing for example. Each semiconductor chip 2 has a surface (a main surface on the semiconductor elements-forming side, an upper surface) 2b and a back surface (a main surface on the side opposite to the main surface located on the semiconductor elements-forming side, a lower surface) 2c. The semiconductor chip 2 is mounted (disposed) on the upper surface (chip bearing surface) 3a of the wiring substrate 3 so that its surface 2b faces upward. The back surface 2c of the semiconductor chip 2 is bonded and fixed to the upper surface 3a of the wiring substrate 3 through a bonding material (die bonding material, bonding material, adhesive) 8. As the bonding material 8 there may be used, for example, an insulating or conductive paste or a filmy bonding material (die bonding film, die attach film). The thickness of the bonding material 8 may be set, for example, at about 20 to 30 µm. The semiconductor chip 2 is provided on its surface 2b with plural electrodes 2a (second electrodes, bonding pads, pad electrodes), the electrodes 2a being connected electrically to a semiconductor element or a semiconductor integrated circuit formed in the interior or a surface layer portion of the semiconductor chip 2.

The wiring substrate 3 has the upper surface (first main surface) 3a as one main surface, the lower surface (second main surface) 3b as a main surface located on the side opposite to the upper surface 3a, plural connecting terminals 15 (first electrodes) formed on the upper surface 3a, and plural lands 16 (land portions) formed on the lower surface 3b.

The wiring substrate 3 further has an insulating base material layer (insulating substrate, core material) 11, a conductor layer (conductor pattern, conductor film pattern, wiring layer) 12 formed on both upper surface 11a and lower surface 11b of the base material layer 11, and a solder resist layer (insulating film) 14 as an insulating layer (insulator layer, insulating film) formed on both upper surface 11a and lower surface 11b of the base material layer 11 so as to cover the conductor layer 12. As another mode, the wiring substrate 3 may be formed using a multi-layer wiring substrate which is a laminate of plural insulating layers and plural wiring layers.

The conductor layer 12 is patterned, serving as wiring or a wiring layer of the wiring substrate 3. The conductor layer 12 is formed of a conductive material is can be formed, for example, by a thin copper film formed by a plating method. Plural connecting terminals (electrodes, first electrodes, bonding pads, pad electrodes) 15 for connection of the bonding wires 4 are formed by the conductor layer 12 present on the upper surface 11a of the base material layer 11, while plural conductive lands (electrodes, pads, terminals) 16 for connection of the solder balls 6 are formed by the conductor layer 12 present on the lower surface 11b of the base material layer 11. Further, plural holes (through holes, via holes) 17 are formed in the base material layer 11 and the conductor layer 12 is formed also on side walls of the holes 17. The connecting terminals 15 on the upper surface 11a of the base material layer 11 are connected electrically to the lands 16 on the lower surface 11b of the base material layer 11 via the conductor layer 12 (lead-out wiring formed by the conductor layer 12) on the upper surface 11a of the base material layer 11, the conductor layer 12 on side walls of the holes 17 and the conductor layer 12 on the lower surface 11b of the base material layer 11. Thus, the plural electrodes of the semiconductor chip 2 are connected electrically to the connecting terminals 15 on the wiring substrate 3 via the bonding wires 4 and are further connected electrically to the lands 16 of the wiring substrate 3 via the conductor layer 12 of the same substrate. The bonding wires 4 are thin metallic wires, e.g., thin gold wires.

The solder resist layer 14 has a function as an insulating layer (insulating film) for protecting the conductor layer and is formed of an insulator material such as, for example, an organic resin material. The solder resist layer 14 is formed on the upper surface 11a and the lower surface 11b of the base material layer 11 so as to cover the conductor layer 12 and it fills up the interior of each hole 17 in the base material layer 11. Since the solder resist layer 14 fills up each hole 17 formed in the base material layer 11, the bonding material 8 for bonding the semiconductor chip 2 to the wiring substrate 3 can be prevented from leaking from the holes 17 toward the lower surface 3b of the wiring substrate 3 and it is also possible to prevent exposure of the back surface 2c of the semiconductor chip 2 from the holes 17. Of the conductor layer 12 of the wiring substrate 3, the connecting terminals 15 and the lands 16 are exposed from (holes in) the solder resist layer 14. The thickness of the solder resist layer 14 on each of the upper surface 11a and the lower surface 11b of the base material layer 11 may be set at, for example, about 20 to 30 µm. The semiconductor chip 2 is bonded through the bonding material 8 onto the solder resist layer 14 on the upper surface 3a side of the wiring substrate 3. An aperture 18 serving as a package index is also formed in the solder resist layer 14 on the upper surface 3a side of the wiring substrate 3. The aperture 18 as a package index formed in the solder resist layer 14 can be used for positioning or for the recognition of direction in the manufacturing process (up to formation of sealing resin 5a to be described later) for the semiconductor device 1.

The lands 16 are arranged in an array form on the lower surface (a main surface on the side opposite to the upper surface 3a, a second main surface) 3b of the wiring substrate 3. Holes 17 are formed next to the lands 16 and solder balls (ball electrodes, salient electrodes, electrodes, external terminals, external connecting terminals) are connected to (formed on) the lands 16 respectively. Thus, the plural solder balls 6 are arranged in an array form on the lower surface 3b of the wiring substrate 3. The solder balls 6 can function as external terminals (external connecting terminals) of the semiconductor device 1. Accordingly, the semiconductor device 1 of this embodiment has plural external connecting terminals (here the solder balls 6) formed respectively on the lands 16 of the lower surface 3b of the wiring substrate 3. Therefore, the electrodes 2a of the semiconductor chip 2 are connected electrically to the connecting terminals 15 of the wiring substrate 3 via the bonding wires 4 and are further connected via the conductor layer 12 of the wiring substrate 3 to the lands 16 of the same substrate and also to the solder balls 6 connected to the lands 16. The number of the solder balls 6 shown in FIG. 2 and that of the connecting terminals 15 shown in FIG. 6 are not the same, but FIGS. 1 to 6 schematically illustrate the structure of the semiconductor device 1 and the number of the solder balls 6 and that of the connecting terminals 15 in the semiconductor device 1 may be changed as necessary. The number of the solder balls 6 and that of the connecting terminals 15 in the semiconductor device 1 may be made equal to or different from each other. Further, solder balls 6 not connected electrically to the electrodes 2a of the semiconductor chip 2 may also be used for heat dissipation.

As to the solder resist layer 14 formed on both upper and lower surfaces of the wiring substrate 3, the solder resist layer 14 formed on the upper surface 3a of the wiring substrate 3 has holes 19 for exposure of the connecting terminals 15. The bonding wires 4 are connected to the connecting terminals 15 exposed from the holes 19 of the solder resist layer 14. To facilitate connection of the bonding wires 4 to the connecting terminals 15, a gold plating layer (or a laminate film of both nickel plating layer (lower layer side) and gold plating layer (upper layer side)) or the like is formed on upper surfaces (connecting surfaces of the bonding wires 4) of the connecting terminals 15 exposed from the holes 19 of the solder resist layer 14.

The sealing resin (sealing resin portion, sealing portion, sealing body) 5 is formed using a resin material such as, for example, a thermosetting resin material and may contain a filler, etc. For example, the sealing resin 5 may be formed using an epoxy resin containing a filler. The sealing resin 5 is formed on the upper surface 3a of the wiring substrate 3 so as to cover the semiconductor chip 2 and the bonding wires 4. That is, the sealing resin 5 is formed on the upper surface 3a of the wiring substrate 3 and seals the semiconductor chip 2 and the bonding wires 4. With the sealing resin 5, the semiconductor chip 2 and the bonding wires 4 are sealed and protected.

Preferably, the semiconductor device 1 has a stepped portion 20 in each side face 1c thereof, the stepped portion 20 being formed by a side face 5c of the sealing resin 5 and a side face 3c of the wiring substrate 3. A lower portion of the side face 5c of the semiconductor device 1 is recessed with respect to an upper portion thereof. More preferably, the stepped portion 20 in the side face 1c of the semiconductor device 1 is formed not in the side face 5c of the sealing resin 5 but in the side face 3c of the wiring substrate 3 and a lower portion 3d of the side face 3c of the wiring substrate 3 is recessed with respect to an upper portion 3e of the side face 3c of the same substrate, with the stepped portion 20 being not formed in the side face 5c of the sealing resin 5.

Next, a description will be given below about a semiconductor device manufacturing method (manufacturing process) according to this embodiment.

Figure 8:
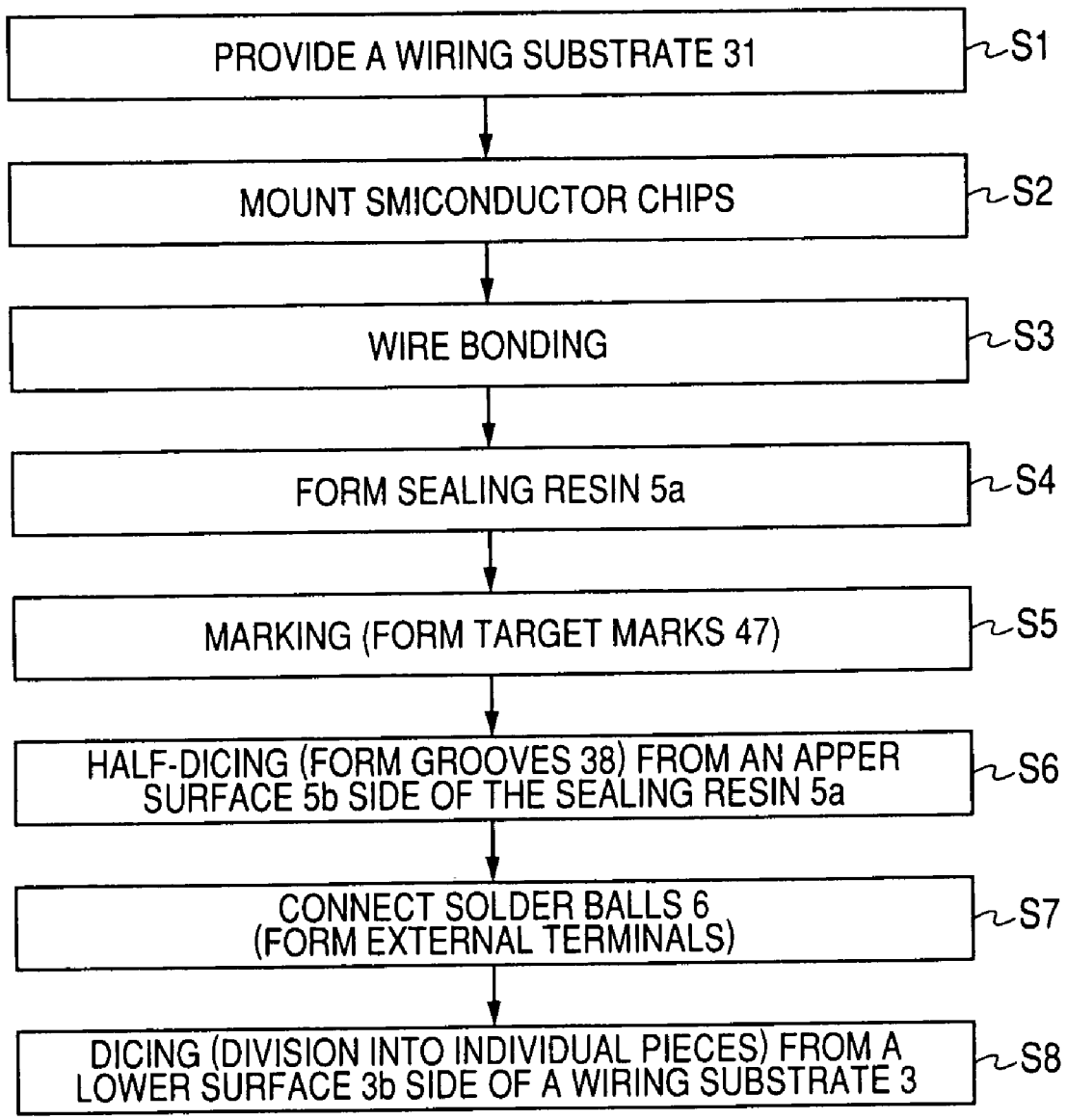
FIG. 8 is a flow chart showing a manufacturing process for the semiconductor device.
Figure 9:
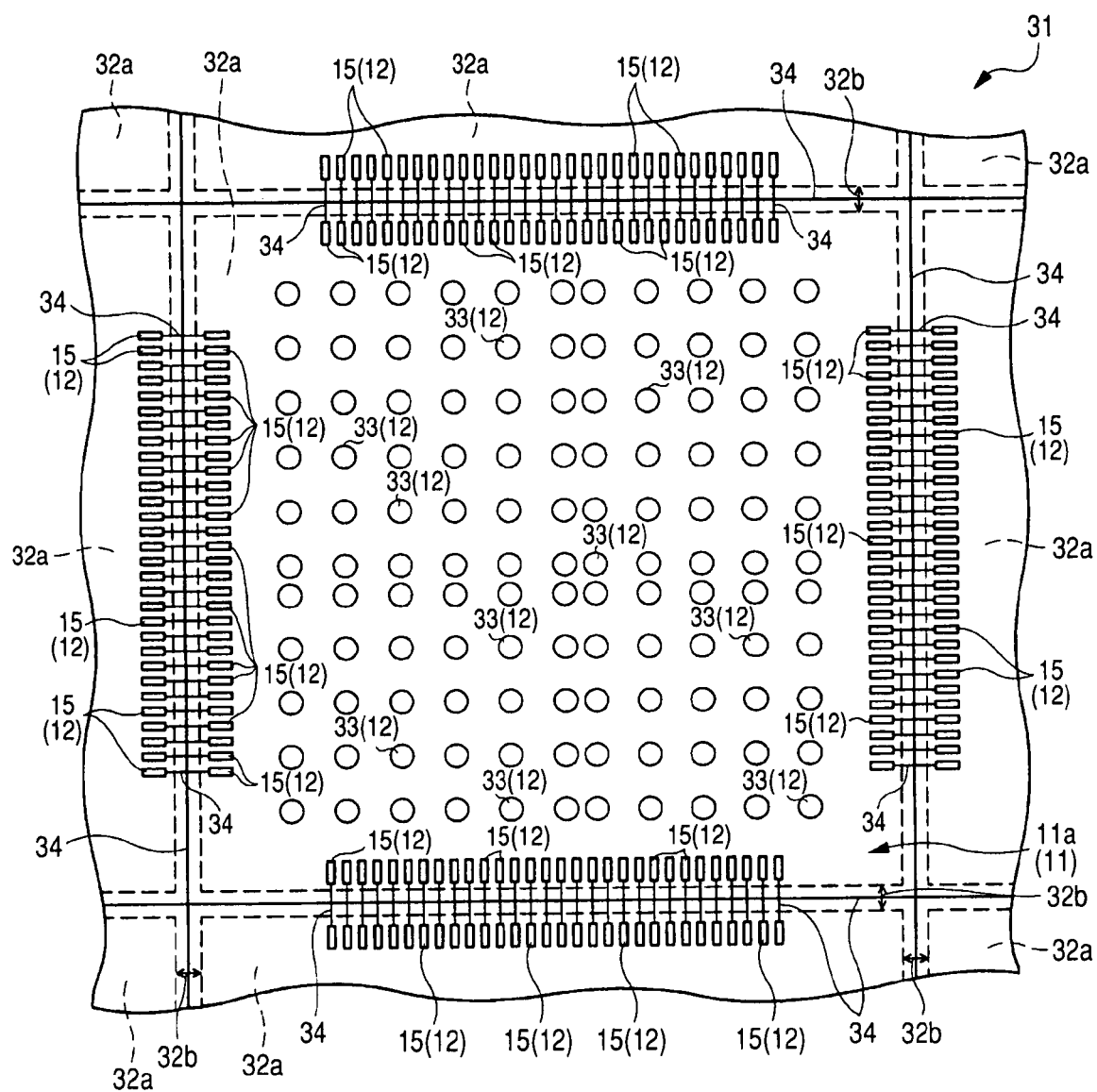
FIG. 9 is a plan view in the manufacturing process of a wiring substrate used in manufacturing the semiconductor device.
Figure 10:
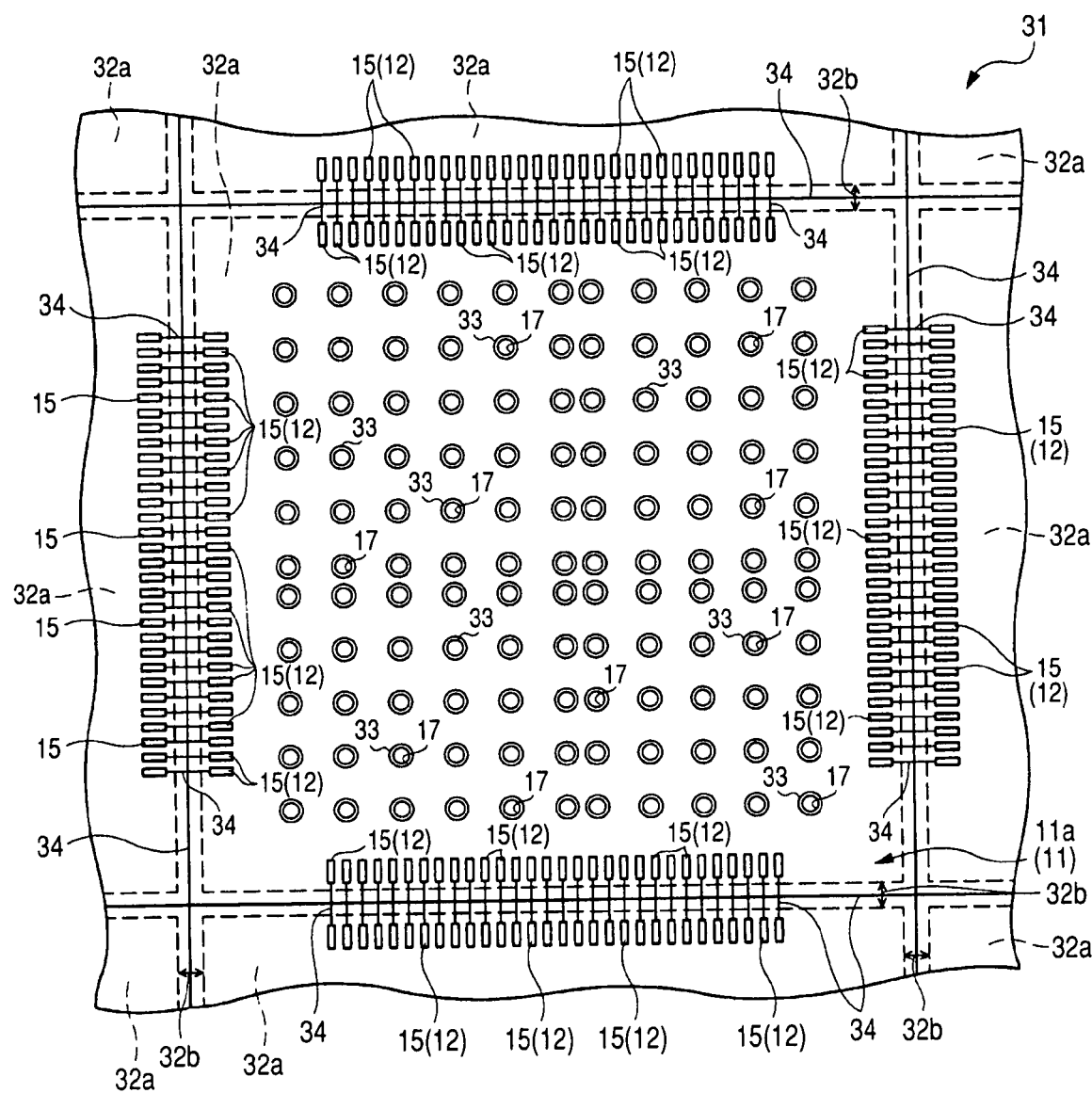
FIG. 10 is a plan view in the manufacturing process of the wiring substrate which follows FIG. 9.
Figure 11:
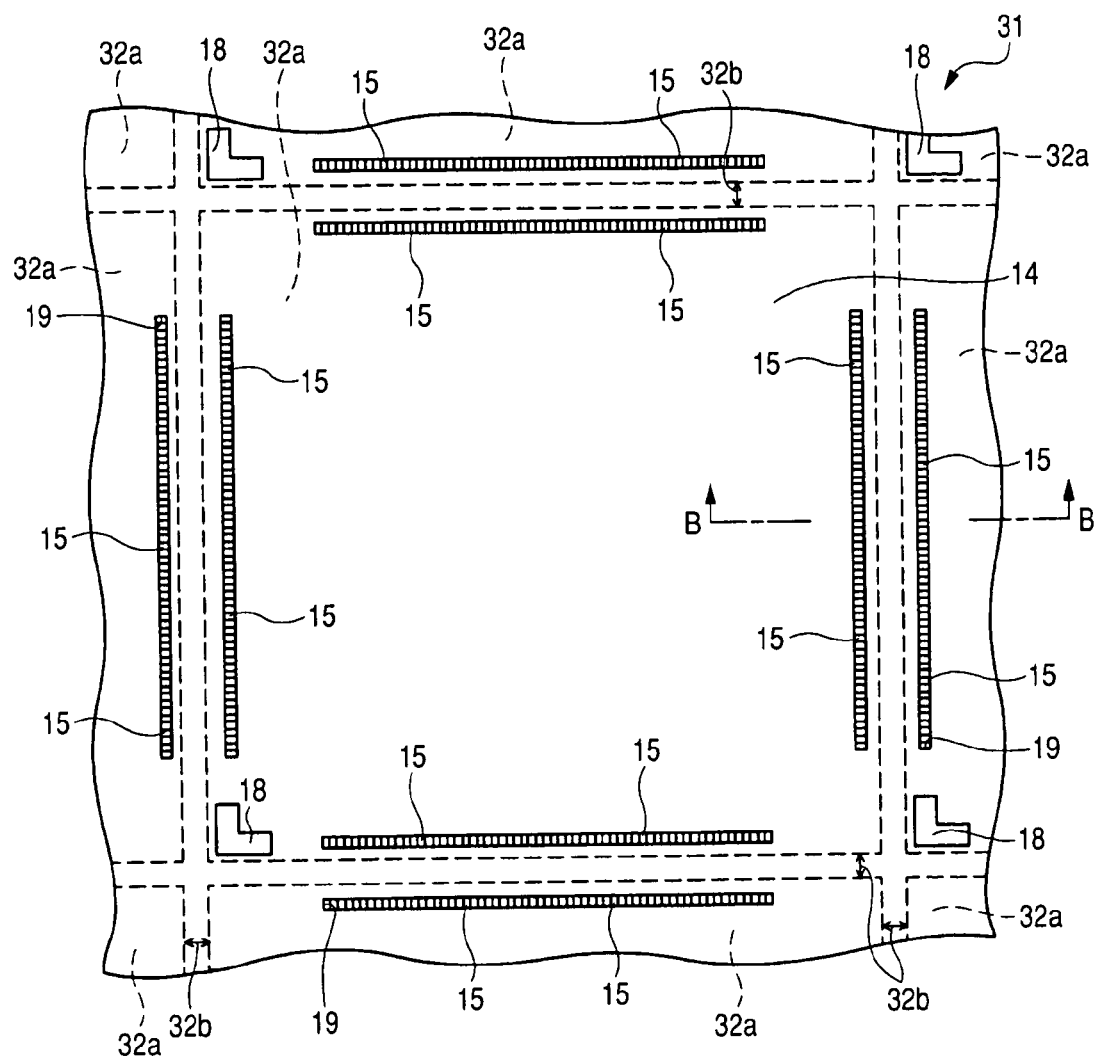
FIG. 11 is a plan view in the manufacturing process of the wiring substrate which follows FIG. 10.
Figure 12:
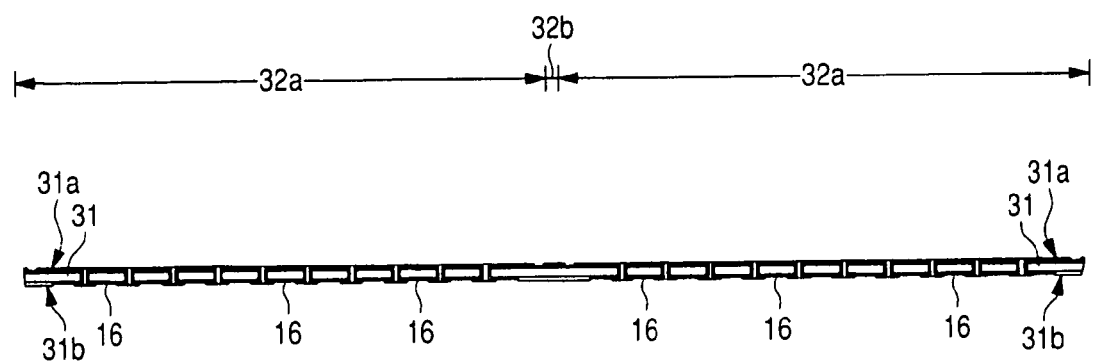
FIG. 12 is a sectional view in the manufacturing process of the semiconductor device.

FIG. 8 is a flow chart showing a manufacturing process for the semiconductor device according to this embodiment. FIGS. 9 to 11 are plan views (top views) showing schematically an example of a manufacturing process for a wiring substrate 31 used in manufacturing the semiconductor device 1 of this embodiment. FIGS. 12 to 28 are sectional views of principal portions in the semiconductor device manufacturing process, of which FIGS. 12, 14, 16, 18, 20, 21, 23, 25 and 27 show sections in various steps of the same area (an area straddling two semiconductor regions 32a), with hatching omitted despite sectional views to make the drawings easier to see. FIGS. 13, 15, 17, 19, 22, 24, 26 and 28 are sectional views (partial enlarged sectional views) of an area near a dicing region 32b between adjacent semiconductor device regions 32a. FIGS. 12 and 13 correspond to the same step, FIGS. 14 and 15 correspond to the same step, FIGS. 16 and 17 correspond to the same step, FIGS. 18 and 19 correspond to the same step, FIGS. 21 and 22 correspond to the same step, FIGS. 23 and 24 correspond to the same step, FIGS. 25 and 26 correspond to the same step, and FIGS. 27 and 28 correspond to the same step.

In this embodiment there is used a matrix wiring substrate (wiring substrate matrix) 31 having plural wiring substrates 3 (semiconductor device regions 32a) arranged in an array form to produce individual semiconductor devices 1. The wiring substrate 31 is a matrix of the wiring substrate 3 described above. When the wiring substrate 31 is cut in a cutting step to be described later into individual semiconductor device regions (substrate regions, unit substrate regions) 32a, each of the thus-divided semiconductor devices 1 corresponds to the wiring substrate 3 described above. The wiring substrate 31 has a configuration such that semiconductor device regions (substrate regions, unit substrate regions) 32a each for formation of a single semiconductor device 1 are arranged in a matrix shape.

First, the wiring substrate 31 is provided (step S1). The wiring substrate 31 can be fabricated for example in the following manner.

An electroless copper plating layer is formed on both upper surface 11a and lower surface of an insulating base material layer 11 as a core material by electroless plating and is then patterned by etching for example. Then, an electrolytic copper plating layer is formed on the electroless copper plating layer by electrolytic plating (electric plating) so that the copper layer becomes thick. The conductor layer 12 described above can be formed by a laminate film (copper layer) both such electroless copper plating layer and electrolytic copper plating layer. In FIG. 9 there is shown a state in which conductor patterns 33 for through holes and (conductor patterns for) connecting terminals 15 are formed on the upper surface of the base material layer 11 by the laminate film (conductor layer 12) of both electroless copper plating layer and electrolytic copper plating layer. The connecting terminals 15 and the conductor patterns 33 are connected together electrically by lead-out lines (not shown) formed by the laminate film (conductor layer 12) of both electroless copper plating layer and electrolytic copper plating layer on the upper surface 11a of the base material layer 11. Though not shown, lands 16 are formed on the lower surface of the base material layer 11 also by the laminate film of both electroless copper plating layer and electrolytic copper plating layer. Since the electrolytic plating method is used, plating lines (power supply lines) 34 are also formed on the upper surface 11a to the base material layer 11. By the supply of a predetermined potential (electric power) via the plating lines 34 it is possible to form an electric copper plating layer on the electroless copper plating layer.

Next, as shown in FIG. 10, holes (through holes, via holes) 17 are formed in the base material layer 11. The holes 17 are formed inside conductor patterns 33 for through holes.

Then, an electroless copper plating layer is formed on a side wall of each hole 17 by electroless plating. The electroless copper plating layer thus formed on the side wall of each hole 17 in the base material layer 11 becomes the conductor layer 12 formed on the side wall of each hole 17. Thereafter, as shown in FIG. 11, a solder resist layer 14 is formed on both upper surface 11a and lower surface of the base material layer 11 by printing for example so as to fill up the holes 17. On the upper surface 11a of the base material layer 11 the connecting terminals 15 are exposed from holes formed in the solder resist layer 14, while on the lower surface 11a of the base material layer 11 lands 16 are exposed from holes formed in the solder resist layer 14. Next, a nickel plating layer and a gold plating layer are formed in this order by electrolytic plating onto the exposed portions (i.e., the connecting terminals 15 and the lands 16) of the copper plating layer on both upper surface 11a and lower surface of the base material layer 11. Subsequently, where required, the base material layer 11 is subjected to outline machining (cutting), whereby the wiring substrate 31 can be formed. The wiring substrate 31 thus provided has plural semiconductor device regions 32a which are to be divided into individual wiring substrates 3 in a cutting step for the wiring substrate 31 which will be described later.

Thus, in step S1, there is provided the wiring substrate 31 having plural semiconductor device regions 32a as unit substrate regions from which the semiconductor devices 1 are to be produced respectively, the wiring substrate 31 having an upper surface 31a (first main surface) and a lower surface 31b (second main surface) located on the side opposite to the upper surface 31a, plural connecting terminals 15 (first electrodes) being formed on the upper surface 31a of each semiconductor device region 32a and plural lands 16 (land portions) formed on the lower surface 31b of each semiconductor device region 32a.

In FIG. 7, in order to make the drawing easier to see, the number of terminals 15 on each wiring substrate 3 is described smaller than the number of terminals 15 in each semiconductor device region 32a on the wiring substrate 31, but actually the number of terminals 15 in each semiconductor device region 32a on the wiring substrate 31 corresponds to the number of terminals 15 on the wiring substrate 3 shown in FIG. 7.

Figure 24:
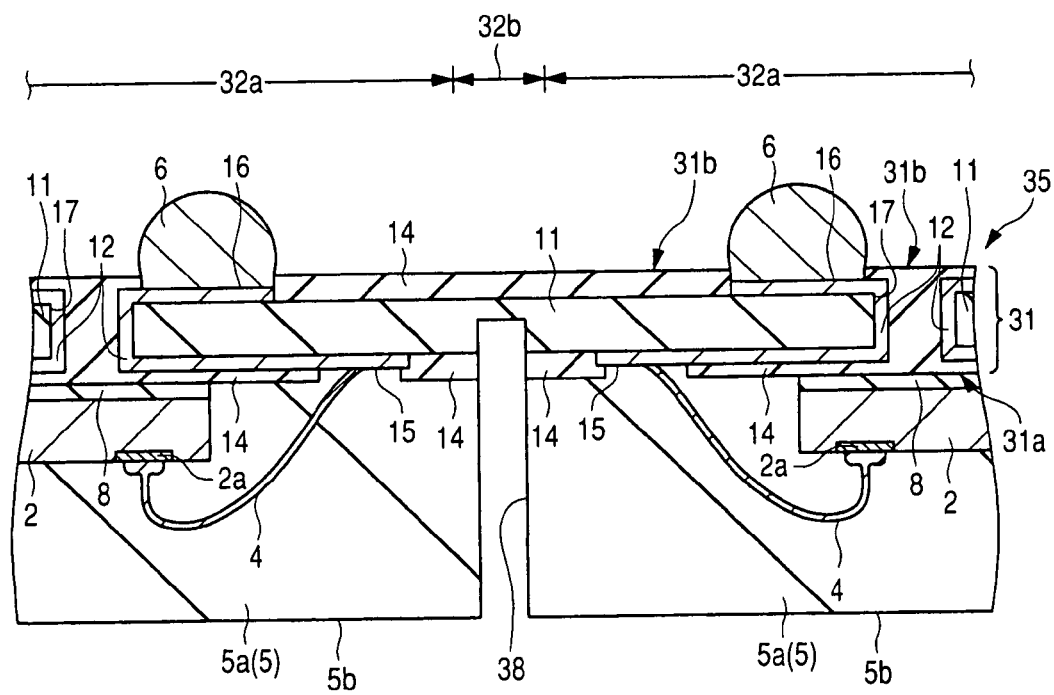
FIG. 24 is a sectional view of a principal portion in the manufacturing process of the semiconductor device like FIG. 23.
Figure 25:
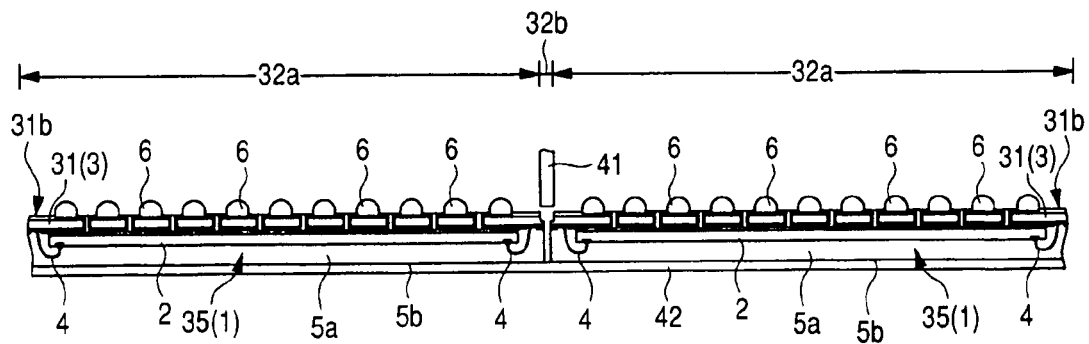
FIG. 25 is a sectional view in the manufacturing process of the semiconductor device which follows FIG. 23.

It is FIGS. 12 and 13 that are sectional views of a principal portion of the wiring substrate 31 thus provided (fabricated). In FIG. 12 there is shown a section of an area straddling two semiconductor device regions 32a on the wiring substrate 31, while in FIG. 13 there is shown a section of an area near a dicing region 32b between adjacent semiconductor device regions 32a, i.e., a section taken on line B-B in FIG. 11. FIGS. 24 and 25 correspond to the same step and so do FIGS. 26 and 27.

Figure 15:
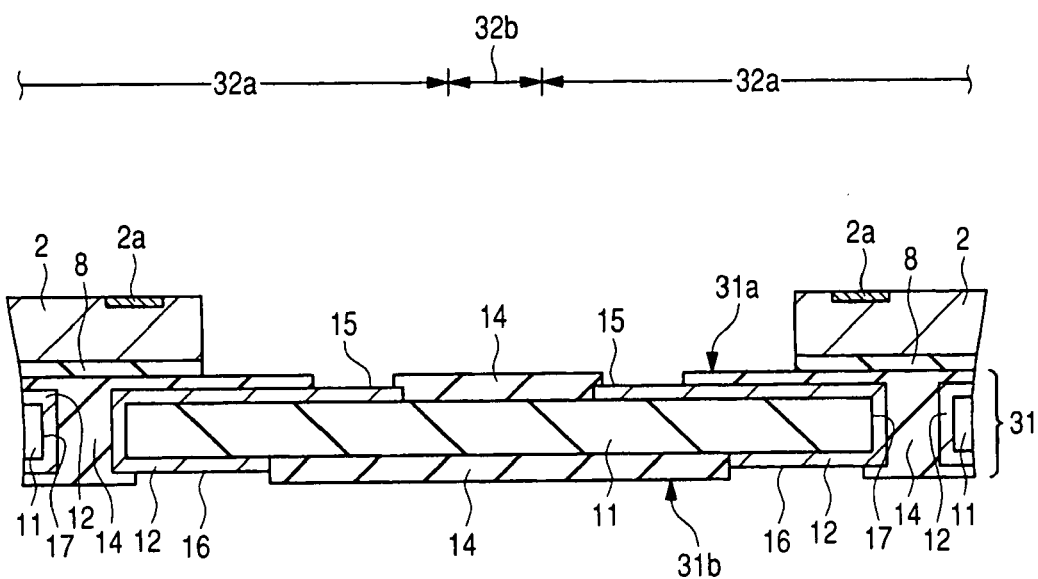
FIG. 15 is a sectional view of a principal portion in the manufacturing process of a semiconductor device like FIG. 14.

After the wiring substrate 31 is provided in step S1, semiconductor chips 2 are mounted and bonded (die bonding, chip mounting) by die bonding through a bonding material 8 onto the semiconductor device regions 32a respectively on the upper surface 31a of the wiring substrate 31, as shown in FIGS. 14 and 15, (step S2). As the bonding material 8 there may be used, for example, a pasty or filmy bonding material.

Figure 16:
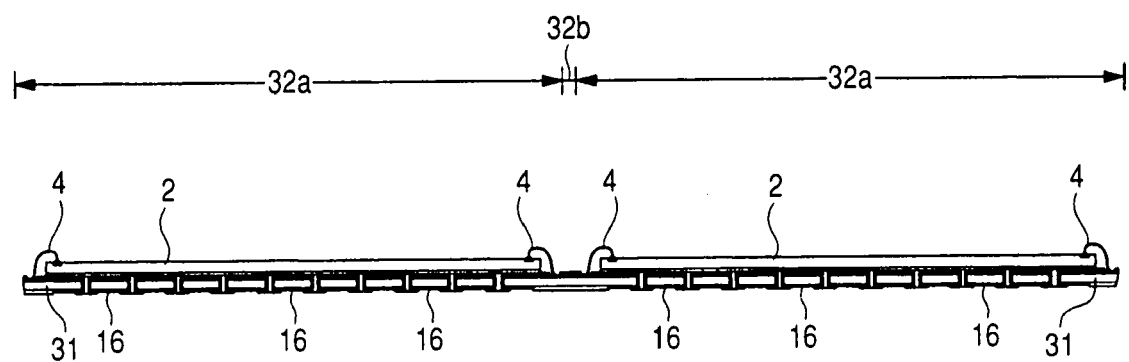
FIG. 16 is a sectional view in the manufacturing process of the semiconductor device which follows FIG. 14.
Figure 17:
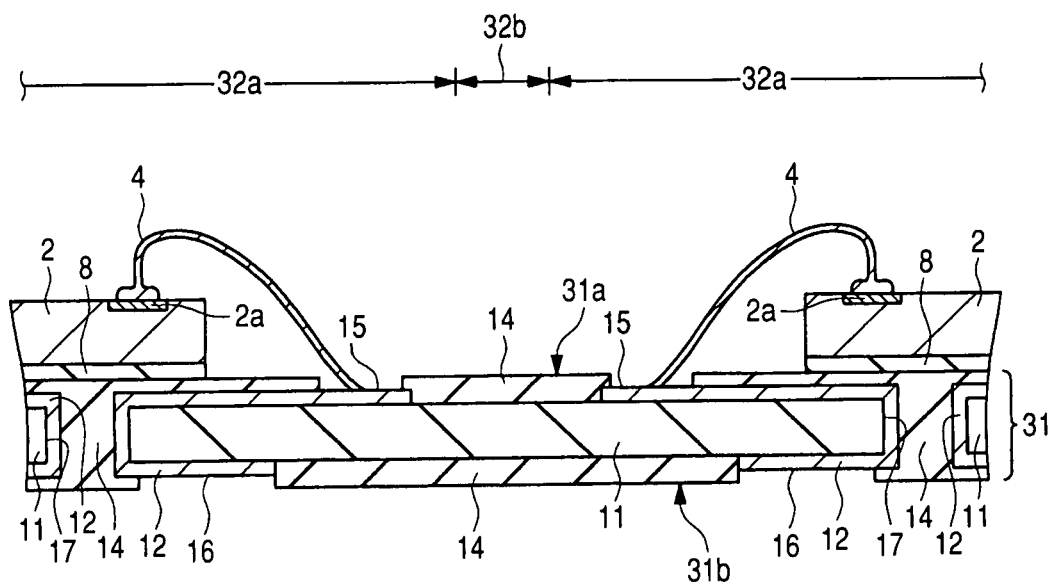
FIG. 17 is a sectional view of a principal portion in the manufacturing process of the semiconductor device like FIG. 16.

Next, as shown in FIGS. 16 and 17, electrodes 2a on each semiconductor chip 2 and corresponding connecting terminals 15 formed on the wiring substrate 31 are connected together electrically through bonding wires 4 by wire bonding (step S3). That is, plural connecting terminals 15 in each semiconductor device region 32a on the upper surface 31a of the wiring substrate 31 and plural electrodes 2a on each semiconductor chip 2 bonded onto the semiconductor device region 32a are connected together electrically through bonding wires 4.

Thus, in steps S2 and S3, the semiconductor chips 2 are mounted onto the semiconductor device regions 32a (unit substrate regions) on the upper surface 31a (first main surface) of the wiring substrate 31 and the electrodes 2a (second electrodes) on the semiconductor chips 2 are connected electrically to the connecting terminals 15 (first electrodes) on the wiring substrate 31. As described above, in step S3, after mounting the semiconductor chip 2 onto the wiring substrate 31 in step S2, the connecting terminals 15 in the semiconductor device regions 32a on the upper surface 31a of the wiring substrate 31 and the electrodes 2a of the semiconductor chips 3 mounted on the semiconductor device regions 32a can be bonded together electrically through the bonding wires 4.

Figure 18:
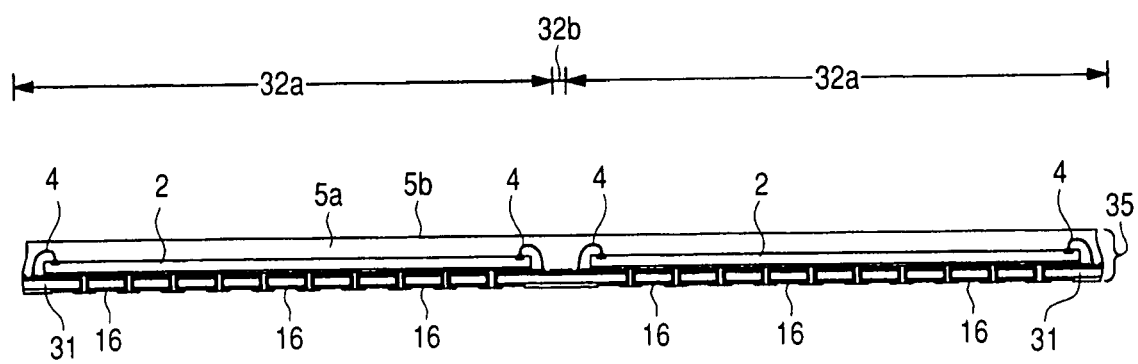
FIG. 18 is a sectional view in the manufacturing process of the semiconductor device which follows FIG. 16.
Figure 19:
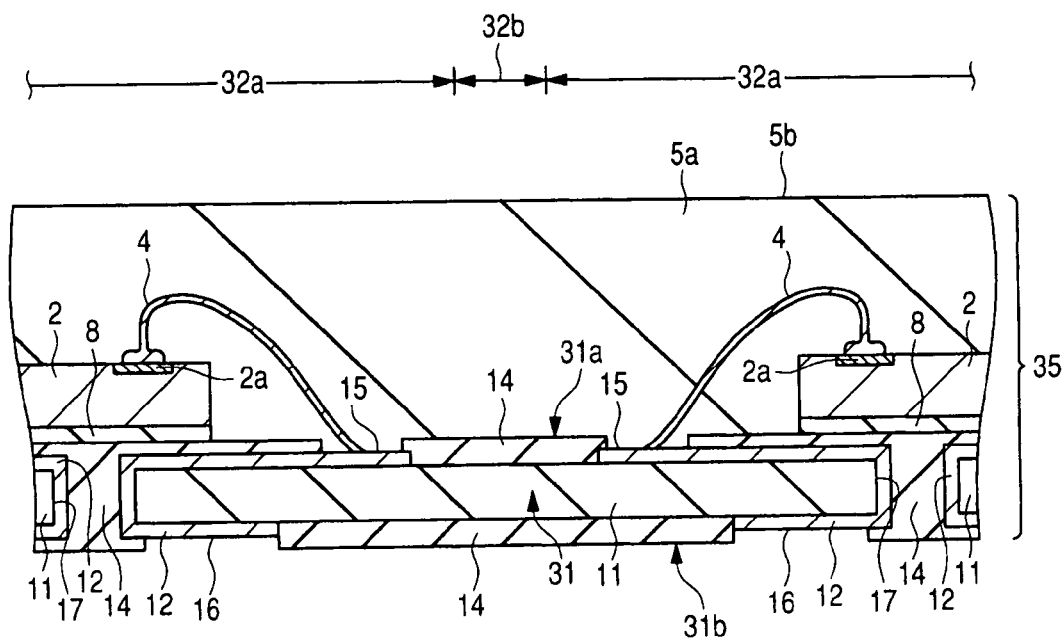
FIG. 19 is a sectional view of a principal portion in the manufacturing process of the semiconductor device like FIG. 18.

Next, as shown in FIGS. 18 and 19, sealing resin (sealing portion, block molding portion) 5a is formed by molding with resin (resin molding step, e.g., transfer molding step) to seal the semiconductor chips 2 and the bonding wires 4 (step S4).

In the molding step S4, block molding is performed to seal the semiconductor device regions 32a on the upper surface 31a of the wiring substrate 31 all together using the sealing resin 5a. That is, the sealing resin 5a is formed over the whole of the semiconductor device regions 32a on the upper surface 31a of the wiring substrate 31 so as to cover the semiconductor chips 2 and the bonding wires 4 in the semiconductor device regions 32a. Thus, the sealing resin 5a is formed so as cover (the whole of) the semiconductor device regions 3 on the upper surface 31a of the wiring substrate 31. The sealing resin 5a is formed using a resin material such as, for example, a thermosetting resin and may contain filler, etc. For example, the sealing resin 5a may be formed using an epoxy resin containing a filler. A sealing body (block molding body, assembly) 35 is formed by the sealing resin 5a (including the semiconductor chips 2 and bonding wires 4 sealed within the sealing resin 5a) on the wiring substrate 31 and the wiring substrates 3. That is, the structure comprising the matrix substrate 31 and the sealing resin 5a as a block molding portion formed thereon is called a sealing body 35.

Thus, in step S4, the sealing resin 5a is formed onto the semiconductor device regions 32a on the upper surface 31a of the wiring substrate 31 so as to cover the semiconductor chips 2, whereby the sealing body 35 comprising the wiring substrate 31 and the sealing resin 5a is formed.

Figure 20:
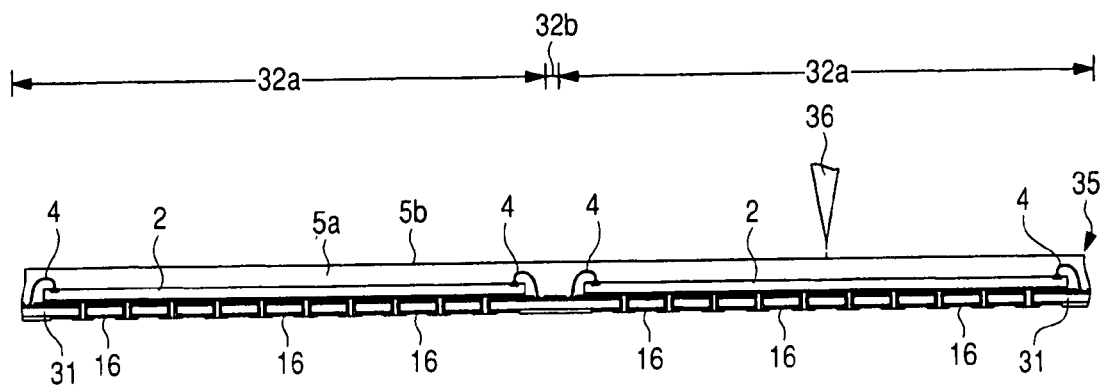
FIG. 20 is a sectional view in the manufacturing process of the semiconductor device which follows FIG. 18.

Next, as shown in FIG. 20, marking is performed to put marks on an upper surface (surface) 5b of the sealing resin 5a (step S5).

In the marking step of step S5, target marks (target marks 47 to be described later) for dicing and, if necessary, marks indicative of product numbers are formed on the upper surface 5b of the sealing resin 5a. For example, the marking step of step S5 can be carried out laser marking which uses a laser 36 or ink marking which uses ink.

Figure 21:
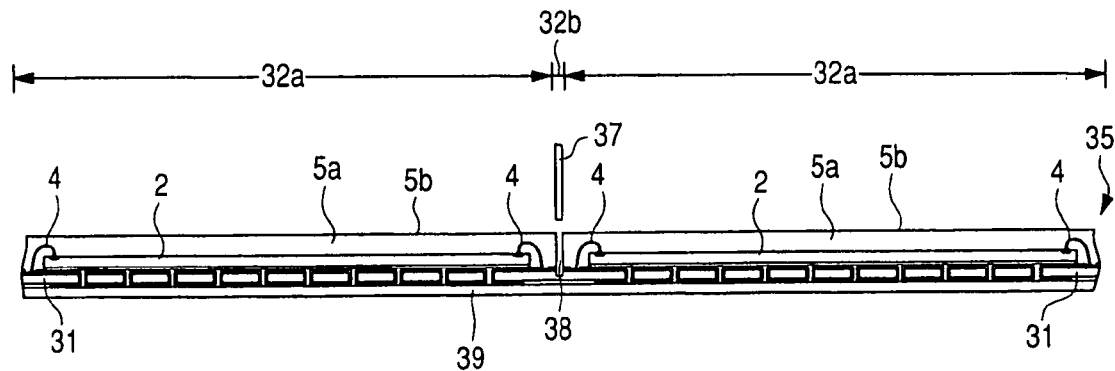
FIG. 21 is a sectional view in the manufacturing process of the semiconductor device which follows FIG. 20.
Figure 22:
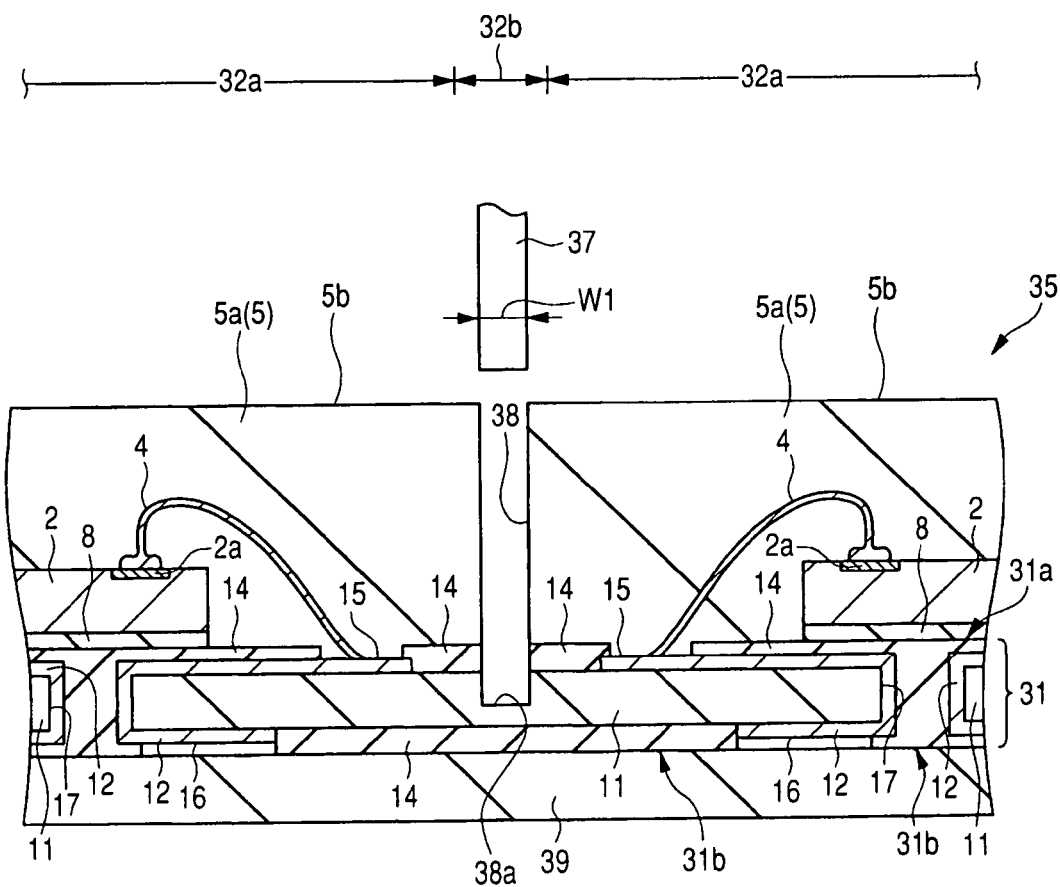
FIG. 22 is a sectional view of a principal portion in the manufacturing process of the semiconductor device like FIG. 21.

Then, as shown in FIGS. 21 and 22, dicing (here half-dicing) is performed from an upper surface 3a side of each wiring substrate 3, namely, from the upper surface 5b side of the sealing resin 5a and along dicing regions (dicing lines) 32b each between adjacent semiconductor device regions 32a to form grooves (slits) 38 in the sealing body 35 (the sealing resin 5a and the wiring substrate 31) (step S6). In this step S6 of forming the grooves 38, there is not performed such full dicing as cuts both sealing resin 5a and wiring substrate 3, (i.e., the sealing body 35), completely, but there is performed half-dicing which causes at least a part of the wiring substrate 31 to remain under a bottom 38a of each groove 38. Preferably, each groove 38 thus formed extends through the sealing resin 5a and its bottom 38a reaches the wiring substrate 31. In step S6, the half-dicing (groove 38-forming) step can be done in a state in which the lower surface 31b of the wiring substrate 31 is affixed to a package fixing tape (fixing tape) 39 to fix the sealing body 35.

Thus, in step S6, the grooves 38 are formed in the sealing body 35 from the upper surface 5b side of the sealing resin 5a and along the dicing regions 32b each between adjacent semiconductor device regions 32a. In this case, the whole of the sealing resin 5a and a part of the wiring substrate 31 are cut along the dicing regions 32a to form the grooves 38. It is preferable that the grooves 38 formed in the sealing body 35 in step S6 reach the wiring substrate 31. In this case, however, care must be exercised so that at least a part of the wiring substrate 31 remains under the bottom 38a of each groove 38 lest the wiring substrate 31 should be divided into individual semiconductor device regions 32a.

In the marking step S5, though the details will be described later, second target marks (target marks 47 to be described later) are formed on the upper surface 5b of the sealing resin 5a on the basis of first target marks (target marks 43 to be described later) formed on the upper surface 31a of the wiring substrate 31. Further, in the half-dicing step S6, grooves 38 are formed in the sealing body 35 from the upper surface 5b side of the sealing resin 5a on the basis of the second target marks (target marks 47 to be described later) formed on the upper surface 5b of the sealing resin 5a.

Figure 23:
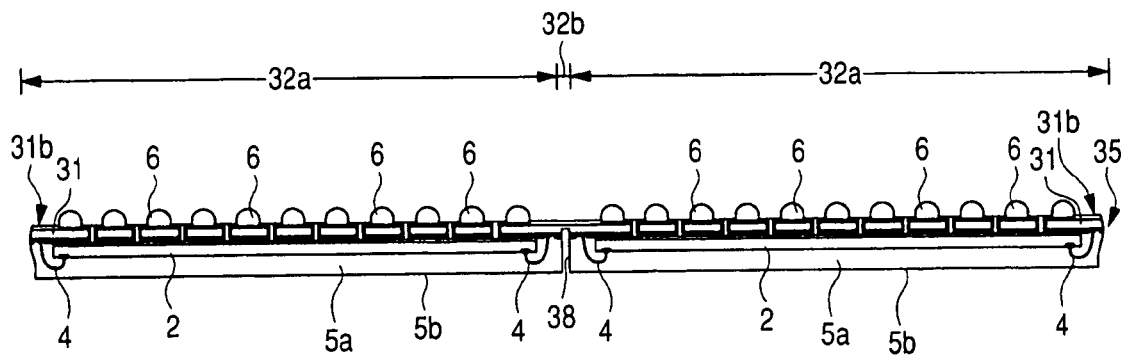
FIG. 23 is a sectional view in the manufacturing process of the semiconductor device which follows FIG. 21.

Then, as shown in FIGS. 23 and 24, solder balls 6 are connected (bonded, formed) to the lands 16 formed on the lower surface 31b of the wiring substrate 31 (step S7). In the solder balls 6 connecting step S7, for example, there may be adopted a method involving facing the lower surface 31b of the wiring substrate 31 upward, disposing solder balls 6 onto the lands 16 on the lower surface 31b of the wiring substrate 31, fixing the solder balls 6 temporarily with flux or the like and melting the solder by reflow (solder reflow, heat treatment), whereby the solder balls 6 and the lands 16 on the lower surface 31b of the wiring substrate 31 can be joined together. Thereafter, washing may be performed where required to remove flux adhered to the surfaces of the solder balls 6. In this way the solder balls 6 as external terminals (external connecting terminals) of each semiconductor device 1 are joined to the lands. That is, after putting the solder balls 6 onto the lands 16 respectively in each semiconductor device region 32a on the lower surface 31b of the wiring substrate 31, the solder balls 6 are bonded onto the lands 16 by solder reflow, whereby external connecting terminals can be formed by the solder balls 6.

Although in this embodiment the solder balls 6 are used as external terminals of each semiconductor device 1, no limitation is made thereto. For example, instead of the solder balls 6, solder may be supplied onto the lands by printing to form external terminals (bump electrodes, solder bumps) of solder on the semiconductor device 1. In this case, solder may be supplied onto each of the lands 16 in each semiconductor device region 32a on the lower surface of the wiring substrate 31, followed by solder reflow, whereby external terminals (bump electrodes, solder bumps) of solder can be formed on the lands.

As the material of the external terminals (here the solder balls 6) of the semiconductor device there may be used lead-containing solder or lead-free solder not containing solder.

Thus, in step S7, external connecting terminals (here the solder balls 6) are formed respectively on the lands 16 in each semiconductor device region 32*a* on the lower surface 31*b* of the wiring substrate 31.

Figure 26:
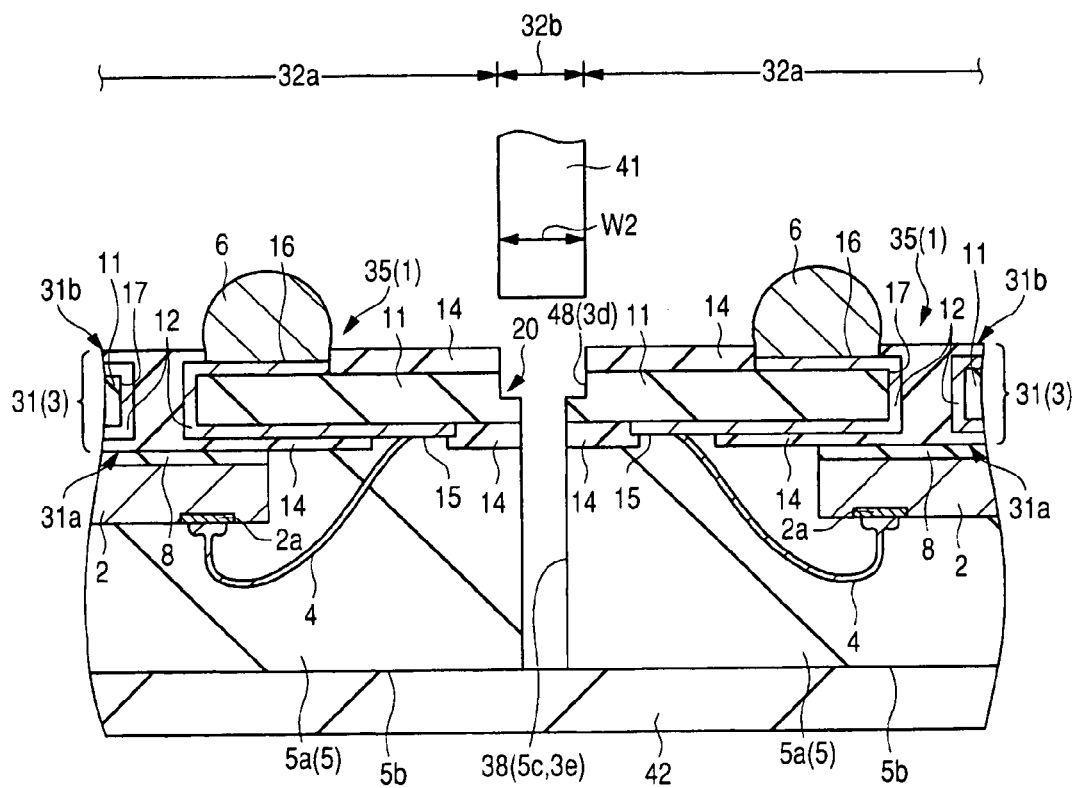
FIG. 26 is a sectional view of a principal portion in the manufacturing process of the semiconductor device like FIG. 25.
Figure 27:
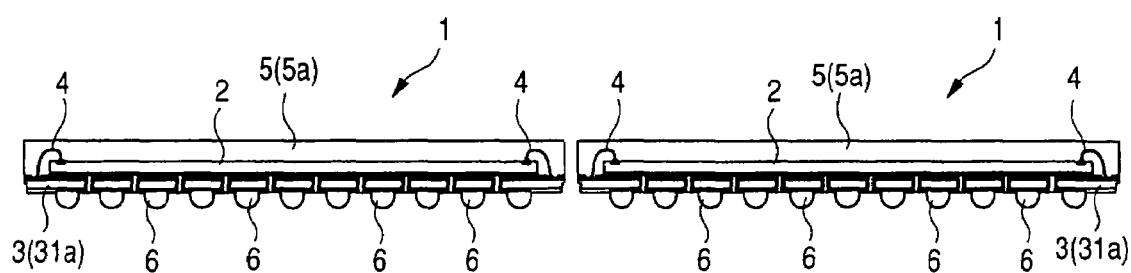
FIG. 27 is a sectional view in the manufacturing process of the semiconductor device which follows FIG. 25.
Figure 28:
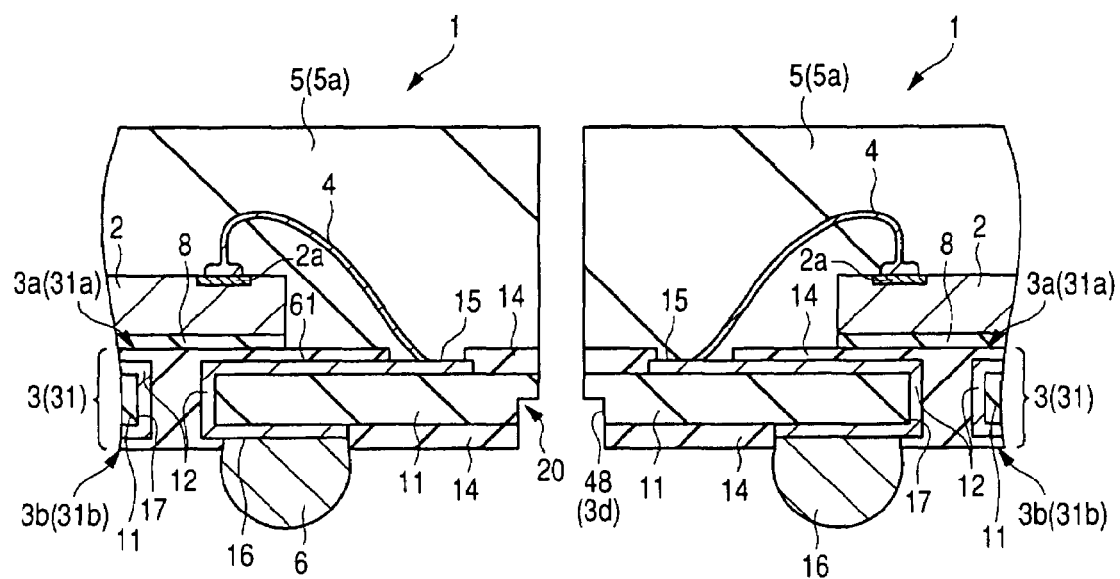
FIG. 28 is a sectional view of a principal portion in the manufacturing process of the semiconductor device like FIG. 27.

Next, as shown in FIGS. 25 and 26, using a dicing blade (dicing saw, blade) 41 or the like, dicing is performed from the lower surface 31*b* side of the wiring substrate 31 and along dicing regions (dicing lines) 32*b* each between adjacent semiconductor device regions 32*a* to cut the sealing body 35 (the wiring substrate 31 and the sealing resin 5*a*) (step S8). For example, in step S8, dicing can be done using the dicing blade 41 in a state in which the upper surface 5*b* of the sealing resin 5*a* is affixed to a package fixing tape (fixing tape) 42 to fix the sealing body 35. In the dicing step S8, the portions of the sealing body 35 remaining under the bottoms (38*a*) of the grooves, here the wiring substrate 31 remaining under the bottoms (38*a*) of the grooves 38, are cut off by the dicing blade 41. That is, in the dicing regions 32*b* each between adjacent semiconductor device regions 32*a*, the portion left uncut in the half-dicing step S6, (the remaining portion of the sealing body 35 (wiring substrate 31), dicing residue)), is cut off (removed) completely in the dicing step S8. As a result, as shown in FIGS. 27 and 28, the sealing body 35 (the wiring substrate 31 and the sealing resin 5*a*) is cut completely along the dicing regions 32*b*, whereby the semiconductor device regions 32*a* (CSP regions) are separated into individual (individualized) semiconductor devices 1 (CSP). That is, the sealing body 35 is cut and divided completely into the individual semiconductor device regions 32*a*.

Thus, in step S8, the sealing body 35 is cut from the lower surface 31*b* side of the wiring substrate 31 and along the dicing regions 32*b* each between adjacent semiconductor device regions 32*a*, whereby in each dicing region 32*b* the portion left uncut in the half-dicing step S6 is cut off in the dicing step S8. That is, by the half-dicing step S6 and the dicing step S8 the sealing body 35 is divided into individual semiconductor device regions 32*a* and semiconductor devices 1 are formed respectively from the semiconductor device regions 32*a*.

Thus, in this embodiment, by the two dicing steps S6 and S8 there are performed cutting and division into individual pieces, whereby such a semiconductor device 1 as shown in FIGS. 1 to 7 can be manufactured. Each of the cut and separated (divided) pieces, i.e., semiconductor device regions 32*a*, of the wiring substrate 31 corresponds to the wiring substrate 3 and each of the cut and separated (divided) pieces, i.e., semiconductor device regions 32*a*, of the sealing resin 5*a* corresponds to the sealing resin 5.

A description will be given below in more detail about features and effects of the semiconductor device and the semiconductor device manufacturing process according to this embodiment.

Reference is here made to a first comparative example different from this embodiment. In the first comparative example, the step S6 of forming the grooves 38 is omitted and, after connection of the solder balls 6, the sealing body 35 is divided into individual semiconductor devices by a single full dicing step from the lower surface 31*b* side of the wiring substrate 31.

In the first comparative example, when performing full dicing from the lower surface 31*b* side of the wiring substrate 31, the dicing can be done on the basis of target marks formed on the lower surface 31*b* of the wiring substrate 31. Since the target marks in question are formed using the patterns of the conductor layer 12 and solder resist layer 14 on the lower surface 31*b* side of the wiring substrate 31, relative positions with respect to the patterns on the lower surface 31*b* side of the wiring substrate 31 can be formed with a high accuracy. However, a discrepancy is apt to occur between the target marks formed on the lower surface 31*b* of the wiring substrate 31 and the patterns on the upper surface 31*a* side of the wiring substrate 31 and a relative positional accuracy between the target marks formed on the lower surface 31*b* of the wiring substrate 31 and the patterns (e.g., connecting terminals 15) on the upper surface 31*a* side of the wiring substrate 31 is apt to become deteriorated. The reason is that for example on the upper surface 31*a* and the lower surface 31*b* of the wiring substrate 31 there are formed patterns such as the conductor layers 12 by different exposure steps using different photomasks and that therefore a relative positional accuracy between the patterns such as the conductor layers 12 on the upper surface 31*a* of the wiring substrate 31 and the patterns such as the conductor layers 12 on the upper surface 31*a* of the same substrate is apt to be deteriorated.

Therefore, in the first comparative example, even if the sealing body 35 is full-diced from the lower surface 31*b* side of the wiring substrate 31 on the basis of the target marks formed on the lower surface 31*b*, a relative positional accuracy of the dicing position with respect to the patterns, e.g., the connecting terminals 15, on the upper surface 31*a* side of the wiring substrate 31 is deteriorated. In the event of deviation of the dicing position, there is the possibility of exposure of the connecting terminals 15 and bonding wires 4 to cut faces of the sealing resin, i.e., side faces of the sealing resin 5 in each semiconductor device manufactured. This leads to a lowering of the semiconductor device manufacturing yield. Even in the event of deviation of the dicing position, in order to prevent exposure of the connecting terminals 15 and the bonding wires 4 from cut faces of the sealing resin 5*a*, namely, from side faces of the sealing resin 5 in each semiconductor device manufactured, it is necessary to increase the margin of the dicing regions 32*b*. However, this leads to an increase in size of each semiconductor device manufactured.

Reference is here made to a second comparative example different from this embodiment. In the second comparative example, the step S6 of forming the grooves 38 is omitted and, after connection of the solder balls 6, the sealing body is divided into individual semiconductor devices by a single full dicing step from the upper surface 31*a* side of the wiring substrate 31.

In the second comparative example, when performing full dicing from the upper surface 31*a* side of the wiring substrate 31, the dicing can be done on the basis of target marks formed on the upper surface 31*a* of the wiring substrate 31. Since the target marks on the upper surface 31*a* of the wiring substrate 31 are formed by the patterns of the conductor layers 12 and solder resist layers 14 on the upper surface 31*a* side, there can be attained a high relative positional accuracy thereof with respect to the patterns on the upper surface 31*a* side. Consequently, in the second comparative example, a relative positional accuracy of the dicing position with respect to the patterns, e.g., the connecting terminals 15, on the upper surface 31*a* of the wiring substrate 31 becomes high and it is possible to prevent exposure of the connecting terminals 15 and bonding wires 4 from cut faces of the sealing resin 5*a*, namely, from side faces of the sealing resin 5 in each semiconductor device manufactured. In the second comparative example, however, when an attempt is made to perform full dicing from the upper surface 5*b* side of the sealing resin portion 5*a*, it is necessary to fix the sealing body 35 from the lower surface 31*b* side of the wiring substrate 31. In this case, it is impossible to fix the sealing body 35 in a satisfactory manner because the solder balls 6 are an obstacle to the fixing work. Consequently, in the second comparative example, full dicing cannot be done in a satisfactory manner from the upper surface 5b side of the sealing resin portion 5a after forming the solder balls 6.

In view of the above circumstances, reference is further made to a third comparative example different from this embodiment. In the third comparative example, the step S6 of forming the grooves 38 is omitted and, before performing the step S7 of connecting the solder balls 6, the sealing body 35 is divided into individual semiconductor devices by a single full dicing step from the upper surface 31a side of the wiring substrate 31, thereafter, the solder balls are connected to each the thus-divided semiconductor devices. In the third comparative example, since the sealing body 35 is full-diced from the upper surface 31a side of the wiring substrate 31 in a state in which the solder balls 6 are not connected to the lower surface 31b of the wiring substrate 31, not only the sealing body 35 can be easily fixed from the lower surface 31b side of the wiring substrate 31, but also a relative positional accuracy of the dicing position can be enhanced. In the third comparative example, however, since it is necessary to connect the solder balls 6 to each of the semiconductor devices divided by full dicing, it is not easy to form the solder balls 6 on each semiconductor device, with a consequent lowering of the semiconductor device throughput and an increase of the semiconductor device manufacturing cost.

On the other hand, in this embodiment, dicing of the sealing body 35 is not performed by a single full dicing step, but the dicing is performed dividedly by the half-dicing step S6 (forming grooves 38) which is performed from the upper surface 5b side of the sealing resin 5a (i.e., the upper surface 31a side of the wiring substrate 31) and the dicing step S8 which is performed from the lower surface 31b side of the wiring substrate 31, the step S7 of connecting the solder balls 6 is performed between both half-dicing and dicing steps.

In this embodiment, in the half-dicing step S6 (forming grooves 38) there is performed half-dicing from the upper surface 5b side of the sealing resin 5a (i.e., the upper surface 31a side of the wiring substrate 31) to form grooves 38 in the sealing body 35. When performing half-dicing from the upper surface 5b side of the sealing resin 5a (i.e., the upper surface 31a side of the wiring substrate 31) in step S6, the dicing can be done on the basis of target marks formed on the upper surface 35a of the sealing body 35 (the upper surface 31a of the wiring substrate 31 or the upper surface 5b of the sealing resin 5a).

Figure 29:
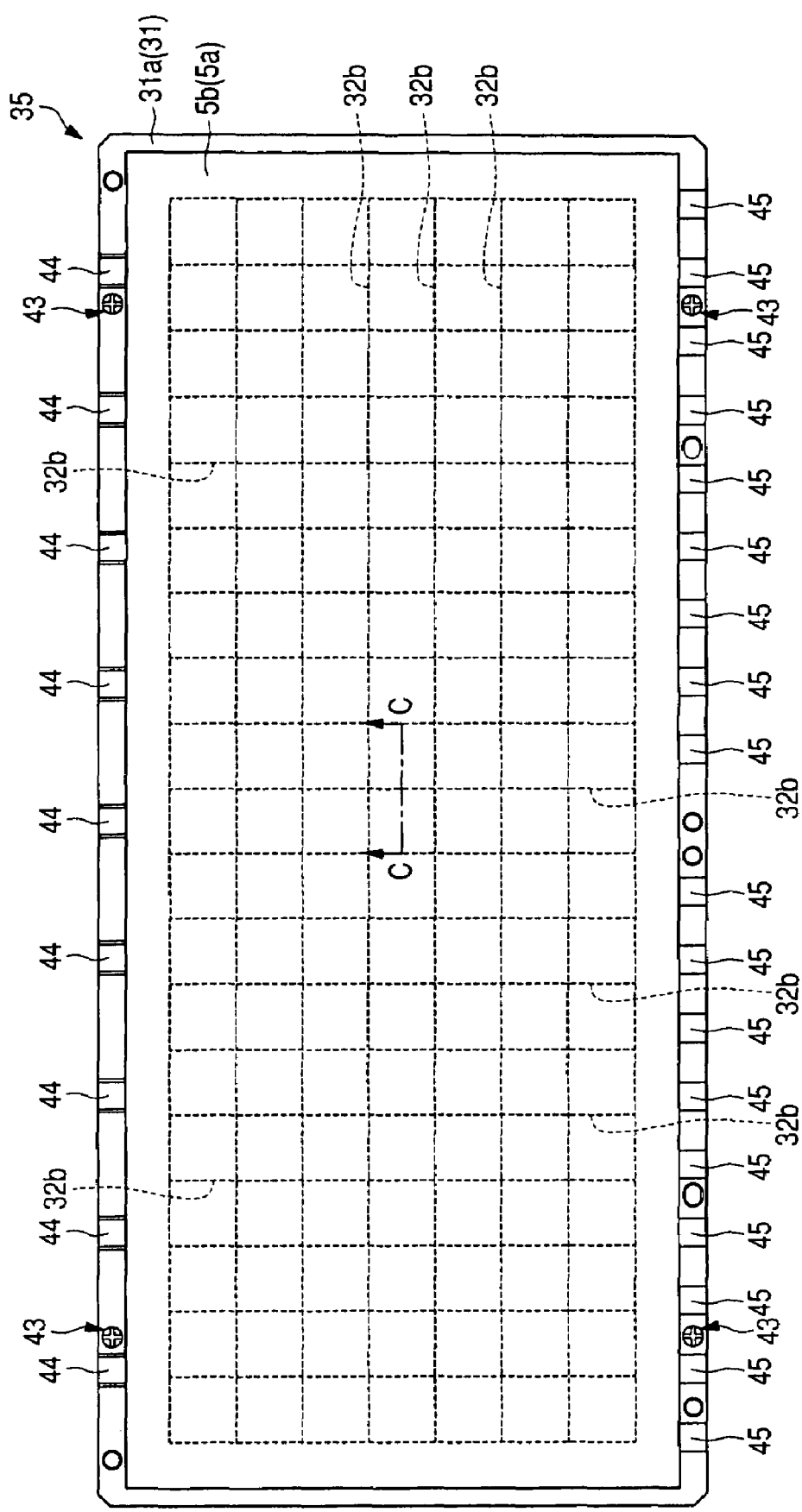
FIG. 29 is a plan view in the manufacturing process of the semiconductor device like FIGS. 18 and 19.
Figure 30:
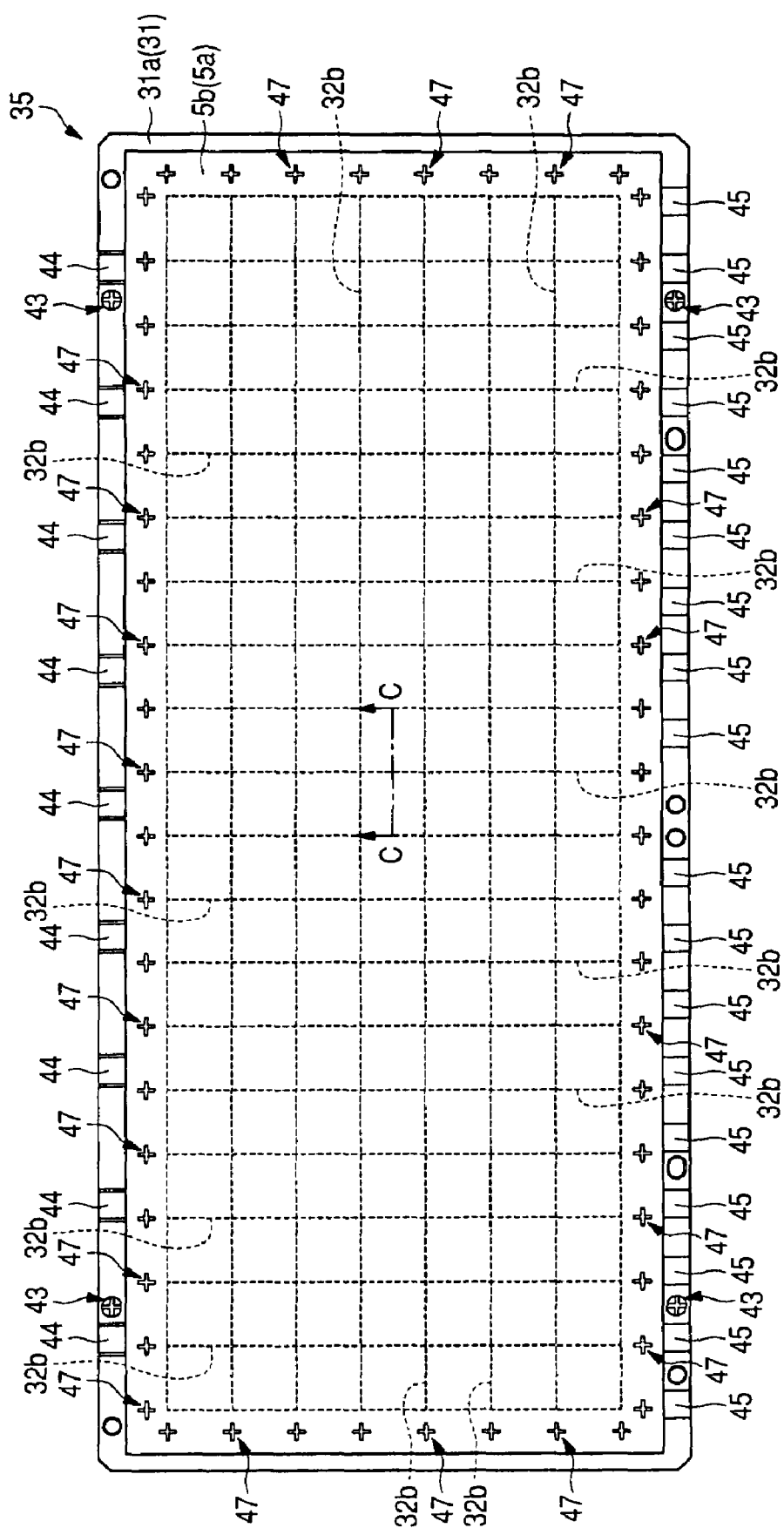
FIG. 30 is a plan view in the manufacturing process of the semiconductor device like FIG. 20.
Figure 31:
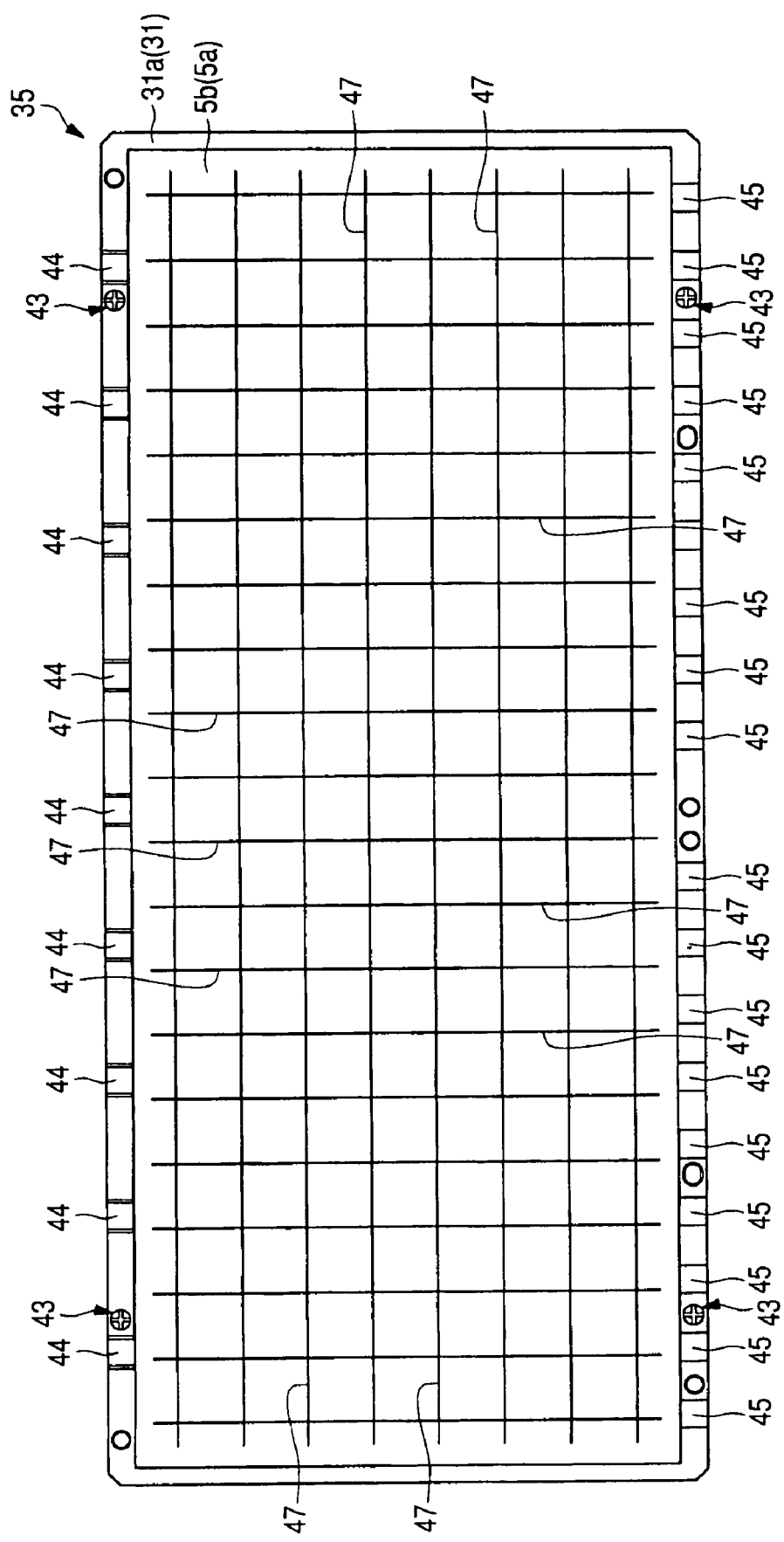
FIG. 31 is a plan view of another mode in the manufacturing process of the semiconductor device like FIG. 20.

FIG. 29 is a plan view in the manufacturing process of the semiconductor device according to this embodiment, showing a plan view (top view) of the sealing body 35 corresponding to the step (step S4 of having formed the sealing resin 5a) shown in FIGS. 18 and 19. The upper surface 31a side of the wiring substrate 31 (the upper surface 5b side of the sealing resin 5a) is shown in the plan view of FIG. 29. FIG. 30 is a plan view in the manufacturing process of the semiconductor device according to this embodiment, showing a plan view (top view) of the sealing body 35 corresponding to the step (step S5 of having formed the target marks 47 by marking) shown in FIG. 20. In FIG. 30, which is a plan view (top view) of an area corresponding to FIG. 29, there is shown the upper surface 31a side of the wiring substrate 31 (the upper surface 5b side of the sealing resin 5a). The section taken on line C-C in FIG. 29 corresponds to FIG. 18 and the section taken on line C-C in FIG. 30 corresponds to FIG. 20. In FIGS. 29 and 30, the dicing regions (dicing lines) 32b are indicated by dotted lines schematically. FIG. 31 is also a plan view in the manufacturing process of the semiconductor device according to the present invention, showing a plan view (top view) of the sealing body 35 in the same step as FIG. 30, but corresponds to a modification in which the shape of target patterns 47 formed is different from that shown in FIG. 30.

In this embodiment, as shown in FIG. 29, target marks (alignment marks) 43 to be used in forming the sealing resin 5a are formed beforehand in the region not covered with the sealing resin 5a on the upper surface 31a of the wiring substrate 31. That is, at the stage of providing the wiring substrate 31 in step S1 there are formed target marks 43 on the upper surface 31a of the wiring substrate 31.

As described above in connection with the above first and second comparative examples, the target marks 43 on the upper surface 31a of the wiring substrate 31 can be formed by the patterns of the conductor layers 12 and solder resist layers 14 on the upper surface 31a side of the wiring substrate 31 and therefore there can be attained a high relative positional accuracy of the target marks 43 with respect to the patterns (e.g., connecting terminals 15) on the upper surface 31a side of the wiring substrate 31. For example, the target marks 43 can be formed by conductor patterns 12 exposed from holes formed in the solder resist layers 14. in the example of FIG. 29, the target marks 43 are formed by conductor patterns 12 of "+" shape exposed from generally circular holes in the solder resist layers 14.

However, since the sealing resin 5a is formed in step S4 onto the upper surface 31a of the wiring substrate 31, if the target marks formed on the upper surface 31a are covered with the sealing resin 5a, the thus-covered target marks become unemployable after formation of the sealing resin 5a. In view of this point, according to this embodiment, the target marks 43 to be used after formation of the sealing resin 5a on the upper surface 31a of the wiring substrate 31 are formed beforehand in the region not covered with the sealing resin 5a on the upper surface 31a. That is, the target marks 43 to be used after formation of the sealing resin 5a are formed beforehand in the peripheral portion (peripheral region, outer periphery portion, outer periphery region, peripheral edge portion) of the upper surface 31a of the wiring substrate 31 so as not to be covered with the sealing resin 5a.

Thus, the target marks 43 (first target marks) on the upper surface 31a of the wiring substrate 31 are formed in the region not covered with the sealing resin 5a on the upper surface 31a, namely, in the peripheral region of the upper surface 31a.

It is also possible to form grooves 38 in the sealing body 35 from the upper surface 5b side of the sealing resin 5a by performing the half-dicing step S6 on the basis of the target marks 43 (first target marks) formed on the upper surface 31a of the wiring substrate 31. In this case, as described above, there is attained a high relative positional accuracy of the target marks 43 with respect to the patterns on the upper surface 31a side of the wiring substrate 31, and by performing half-dicing on the basis of the target marks 43 in step S6 a relative positional accuracy of the half-dicing position (the position of each groove 38) with respect to the patterns (e.g., connecting terminals 15) on the upper surface 31a side of the wiring substrate 31 becomes higher.

However, since the target marks to be used after formation of the sealing resin 5a can be formed in only the region not covered with the sealing resin 5 on the upper surface 31a of the wiring substrate 31, it is difficult to provide such target marks on the upper surface 31a of the wiring substrate 31 at every dicing line in the dicing step. In the peripheral portion of the upper surface 31a of the wiring substrate 31, the same resin (gate resin) 44 as the sealing resin is formed over the regions corresponding to rein injection ports (gates) for injection of resin into mold cavities in the molding step (the step of forming the sealing resin 5a). The resin 44 can be regarded as part of the sealing resin 5a. The target marks to be used after formation of the sealing resin 5a can be disposed in the peripheral portion of the upper surface 31a of the wiring substrate 31, but cannot be disposed in the regions where the resin 44 is formed. Further, in the peripheral portion of the upper surface 31a of the wiring substrate 31, the target marks 43 cannot be disposed in regions 45, either, that serve as air vents for the release of air from within the mold cavities to the exterior at the time of injecting resin into the cavities in the molding step (the step of forming the sealing resin 5a). Thus, on the upper surface 31a of the wiring substrate 31, the positions where the target marks 43 to be used after formation of the sealing resin 5a are not so many, but are only a part of the peripheral portion of the upper surface 31a of the wiring substrate 31. This point also makes it difficult to provide target marks at every dicing line on the upper surface 31a of the wiring substrate 31 in the dicing step.

In view of this point, according to this embodiment, as shown in FIG. 29, the target marks 43 (first target marks) are provided beforehand in the region not covered with the sealing resin 5a (including the resin 44) on the upper surface 31a of the wiring substrate 31, here a part of the peripheral portion of the upper surface 31a. Then, as shown in FIG. 30, it is preferable that target marks (alignment marks) 47 (second target marks) for dicing be formed on the upper surface 5b of the sealing resin 5a in the marking step S5 on the basis of the target marks 43 formed on the upper surface 31a of the wiring substrate 31. That is, in the marking step S5, a marking position (target mark 47 forming position) is established on the basis of the target marks 43 and target marks 47 are formed on the upper surface 5b of the sealing resin 5a.

As shown in FIG. 20 to which reference has been made above, the target marks 47 can be formed on the upper surface 5b of the sealing resin 5a with use of the laser 36 or the like, and in the example of FIG. 30 they are formed as "+" marks. As shown in FIG. 31, the target marks 47 may be formed in a linear shape so as to overlap the dicing regions (dicing lines) 32b. In both cases of FIGS. 30 and 31 the target marks 47 are formed at every dicing region (dicing line) 32b.

On the upper surface 5b of the sealing resin 5a, the target marks 47 may be disposed in any other region than the region where such marks as product numbers are formed. For example, even if such marks as product numbers are formed on the upper surface 5b of the sealing resin 5a, since they are formed nearly centrally of each of the semiconductor device regions 32a and not formed on the dicing regions 32b, they are not an obstacle to the layout of target marks 47. Thus, the disposable area of the target marks 47 on the upper surface 5b of the sealing resin 5a is wider than that of the first target marks 43 on the upper surface 31a of the wiring substrate 31. Besides, the upper surface 5b of the sealing resin 5a is nearly flat and is easy to effect marking. Therefore, as shown also in FIGS. 30 and 31, the target marks 47 can be provided for each dicing region 32b (dicing line) in the dicing step on the upper surface 5b of the sealing resin 5a.

In the half-dicing step S6 (the step of forming grooves 38) in this embodiment it is preferable that the grooves 38 be formed in the sealing body 35 from the upper surface 5b side of the sealing resin 5a on the basis of the target marks 47 (second target marks) formed on the upper surface 5b rather than forming the grooves 38 on the basis of the target marks 43 formed on the upper surface 31a of the wiring substrate 31. That is, in the half-dicing step S6, a dicing position (groove 38 forming position) is established on the basis of the target marks 47 on the upper surfaces 5b of the sealing resin 5a and grooves 38 are formed in the sealing body 35.

Thus, the target marks 47 on the upper surface 31a of the wiring substrate 31 are alignment marks (target marks) for establishing positions of the target marks 47 at the time of forming the target marks 47 on the upper surface 5b of the sealing resin 5a, and the target marks 47 are alignment marks (target marks) for establishing a dicing position (groove 38 forming position) when forming grooves 38 in the sealing body 35 in the half-dicing step S6.

As described above, in the marking step S5 the target marks 47 for dicing are formed for each dicing region (dicing line) 32b on the upper surface 5b of the sealing resin 5a, so in the half-dicing step S6 (the step of forming grooves 38) grooves 38 can be formed by performing half-dicing on the basis of the target marks 47 formed for each dicing region (dicing line) 32b. Therefore, in the half-dicing step S6, at every operation of the dicing blade 37 for forming one groove 38, a relative moving position of the dicing blade with respect to the sealing body 35 can be established on the basis of the target marks 47 provided for the dicing region (dicing line) 32b associated with that groove 38 and then the grooves 38 can be formed by the dicing blade 37.

In this embodiment, since it is possible to effect half-dicing (forming grooves 38) on the basis of the target marks 47 formed for each dicing region 32b, the accuracy of the dicing position (groove 38 forming position) in the half-dicing step S6 (forming grooves 38) can be more enhanced and so can be a relative positional accuracy of the half-dicing position (groove 38 forming position) with respect to the patterns, e.g., the connecting terminals 15, on the upper surface 31a side of the wiring substrate 31.

Since the target marks 43 formed on the upper surface 31a of the wiring substrate 31 are formed by the patterns of the conductor layers 12 and solder resist layers 14 on the upper source 31a side of the wiring substrate 31, there can be attained a high relative positional accuracy thereof with respect to the patterns (e.g., connecting terminals 15) on the upper surface 31a side of the wiring substrate 31. Also as to the second target marks 47 on the upper surface 31a of the wiring substrate 31, since they are formed on the basis of the target marks 43 formed on the upper surface 31a of the wiring substrate 31, there can be attained a high relative positional accuracy thereof with respect to the patterns (e.g., connecting terminals 15) on the upper surface 31a side of the wiring substrate 31 as is the case with the first target marks on the upper surface 31 of the wiring substrate 31. Since the half-dicing of step S6 is performed on the basis of such target marks 47 on the upper surface 5b of the sealing resin 5a, a relative positional accuracy of the half-dicing position with respect to the patterns (e.g., connecting terminals 15) on the upper surface 31a of the wiring substrate 31 can be enhanced in the half-dicing step S6 and it is possible to prevent exposure of the connecting terminals 15 and bonding wires 4 from the grooves 38 formed in the sealing resin 5a. Consequently, it is possible to prevent exposure of the connecting terminals 15 and bonding wires 4 from side faces 1c of each semiconductor device manufactured.

If bonding wires 4 are exposed from the side faces 1c of a semiconductor device 1 manufactured, the electric connection between the electrodes 2a on the semiconductor chip 2 and the connecting terminals 15 on the wiring substrate 3 through the bonding wires 4 may be cut off or there may occur a short-circuit through the exposed bonding wires 4 and such a semiconductor device is removed as a defective product in a subsequent inspection step. As a result, the semiconductor device manufacturing yield is deteriorated.

Likewise, if connecting terminals 15 are exposed from side faces 1c of a semiconductor device 1 manufactured, contact surfaces of the conductor patterns which constitute the connecting terminals 15 with the sealing resin 5 are exposed from the side faces 1c of the semiconductor device 1 because the solder resist layer 14 is not formed on the connecting terminals 15. However, the strength of adhesion between the conductor patterns which constitute the connecting terminals 15 and the sealing resin 5 is lower than that between the solder resist layer 14 and the sealing resin 5. Therefore, if connecting terminals 15 are exposed from side faces 1c of the semiconductor device 1 manufactured, water or the like may enter the interior of the semiconductor device 1 from interfaces between the exposed connecting terminals 15 and the sealing resin 5, causing deterioration of the moisture resistance of the semiconductor device 1 and hence a lowering of the semiconductor device manufacturing yield.

On the other hand, in this embodiment, as described above, it is possible to prevent exposure of the connecting terminals 15 and bonding wires 4 from side faces 1c of each semiconductor device manufactured. Consequently, it is possible to improve the manufacturing yield of the semiconductor device 1. Besides, it is possible to improve the reliability of each semiconductor device 1 manufactured. Moreover, the size of each semiconductor device 1 can be reduced because it is possible to reduce the margin of the dicing regions 32b.

Further, in this embodiment, the half-dicing step S6 (the step of forming grooves 38) is performed before the external terminals (solder balls 6) in step S7 (namely, in an unconnected state of the solder balls 6), so when fixing the sealing body 35 for the half-dicing of step S6, such external terminals as the solder balls 6 are not an obstacle to the fixing work and the sealing body 35 can be fixed easily and accurately from the lower surface 31b side of the wiring substrate 31. Thus, in the half-dicing step S6 (the step of forming grooves 38), grooves 38 can be formed in the sealing body 35 accurately from the upper surface 5b side of the sealing resin 5a. If this embodiment is applied to the case where the external connecting terminals (external terminals) formed respectively on the lands 16 in each semiconductor device region 32a on the lower surface 31b of the wiring substrate 31 in step S7 are formed of solder, there is obtained an outstanding effect, and if it is applied to the case where the external connecting terminals (external terminals) are the solder balls 6, there is obtained a more outstanding effect.

In this embodiment, external terminals are formed (solder balls 6 are connected) in step S7 after the half-dicing step S6 (the step of forming grooves 38). In the half-dicing step S6 (the step of forming grooves 38) there is performed half-dicing, not full dicing, allowing at least a part of the wiring substrate 31 to remain under the bottom 38a of each groove 38. Therefore, the sealing body 35 (wiring substrate 31) is not cut completely and hence is not divided into individual pieces. Thus, in step S7, the solder balls 6 are connected to the lower surface 31b of the wiring substrate 31 in the sealing body 35 not divided into individual pieces to form external terminals. Accordingly, the connecting step of solder balls 6 (the step of forming external terminals) is easy in comparison with the case where the solder balls 6 are connected to each of divided semiconductor devices. As a result, the semiconductor device and the semiconductor device manufacturing process can be simplified and it is possible to improve the throughput of semiconductor devices and reduce the semiconductor device manufacturing cost.

In step S4 of forming the sealing resin 5a (the step of forming the sealing body 35), the sealing resin 5a (sealing body 35) is formed so as to cover the plural semiconductor device regions 32a and therefore the wiring substrate 31 with the sealing resin 5a (sealing body 35) formed thereon at a time is apt to warp. Consequently, if an attempt is made to form external terminals after formation of the sealing resin 5a (sealing body 35), it may become difficult to connect the external terminals stably under the influence of warp of the wiring substrate 31. In this embodiment, however, since grooves 38 are formed in the wiring substrate 31 in the half-dicing step S6 before forming external terminals (solder balls 6), it is possible to diminish (mitigate) the warp (amount of warp) of the wiring substrate 31. As a result, external terminals (solder balls 6) can be formed stably on the wiring substrate 31.

In this embodiment, moreover, after forming external terminals (solder balls 6) in step S7, dicing is performed from the lower surface 31b side of the wiring substrate 31 in step S8 to divide the sealing body 35 into individual pieces. In step S8 dicing is performed with solder balls 6 (external terminals) formed on the lower surface 31b of the wiring substrate 31, but the dicing is performed from the lower surface 31b side of the wiring substrate 31, so when fixing the sealing body 35 for the dicing of step S8, the upper surface 5b side of the sealing resin 5a may be fixed with the package fixing tape 42 for example. Thus, the solder balls 6 (external terminals) do not obstruct the fixing work and the sealing body 35 can be fixed accurately. Consequently, in the dicing step S8 it is possible to effect dicing accurately from the lower surface 31b side of the wiring substrate 31.

As described above in connection with the first comparative example, the target marks formed on the lower surface 31b of the wiring substrate 31 are apt to undergo dislocation with respect to the patterns formed on the upper surface 31a of the wiring substrate 31 and a relative positional accuracy between the target marks formed on the lower surface 31b of the wiring substrate 31 and the patterns (e.g., connecting terminals 15) formed on the upper surface 31a of the wiring substrate 31 is apt to be deteriorated. Therefore, in the dicing step S8 of performing dicing from the lower surface 31b side of the wiring substrate 31, a relative positional accuracy of the dicing position with respect to the patterns (e.g., connecting terminals 15) formed on the upper surface 31a of the wiring substrate is likely to become lower than in the half-dicing step S6 (forming grooves 38) of performing half-dicing from the upper surface 5b side of the sealing resin 5a.

Consequently, if the grooves 38 do not reach the wiring substrate 31 (stop halfway of the sealing resin 5a), it is necessary that the sealing resin 5a and the wiring substrate 31 remaining under the bottom (38a) of each groove 38 be cut off completely in the dicing step S8. As a result, cut faces 48 of the sealing body 35 resulting from the dicing in step S8 reach (are formed in) not only the wiring substrate 31 but also the sealing resin 5a. In this case, when dicing is performed up to the sealing resin 5a from the lower surface 31b side of the wiring substrate 31 in step S8 which is lower in positional accuracy than in the half-dicing of step S6 performed from the upper surface 5b side of the sealing resin 5a, there is the possibility that bonding wires 4 may be exposed from the cut faces 48 formed by the dicing of step S8, with a consequent lowering of the semiconductor device manufacturing yield.

Accordingly, it is preferable in this embodiment to take some measure so that the grooves 38 formed in the half-dicing step S6 reach the wiring substrate 31. More specifically, according to this embodiment, in the half-dicing step S6 the whole of the sealing resin 5a and a part of the wiring substrate 31 are cut along the dicing regions 32b to form grooves 38 in both sealing resin 5a and wiring substrate 31, the grooves 38 (the bottoms thereof) reaching the wiring substrate 31. In each dicing region 32b, the portion left uncut in the half-dicing step S8 is cut in the dicing step S8, so in the dicing step S8 performed from the lower surface 31b side of the wiring substrate 31 which is lower in positional accuracy than in the half-dicing step S6 performed from the upper surface 5b side of the sealing resin 5a, it suffices to cut the wiring substrate 31 and it is not necessary to cut the sealing resin 5a. Therefore, in the dicing step S8, the dicing blade 41 does not reach the position corresponding to the upper surface 31a of the wiring substrate 31, so that the cut faces 48 formed by the dicing of step S8 do not reach the sealing resin 5a, but can be formed in only the wiring substrate 31. Accordingly, even if the dicing step S8 is lower in a relative positional accuracy of the dicing position with respect to the patterns formed on the upper surface 31a of the wiring substrate 31 than the half-dicing step S6, the patterns (e.g., connecting terminals 15) to be retained on the upper surface 3a of the wiring substrate 3 in each semiconductor device 1 can be prevented from being cut by the dicing blade 41 in the dicing step S8. Besides, in the dicing step S8, the wiring substrate 31 is cut, but the sealing resin 5a is not cut, so even if the accuracy of the dicing position in the dicing step S8 is low, it is possible to prevent exposure of the connecting terminals 15 and bonding wires 4 from the cut faces formed in the dicing step S8. Since side faces 5a of the sealing resin 5 and upper portions 4e of side faces 4c of the wiring substrate 3 are defined (formed) by the cut faces formed in the half-dicing step S6 of a high positional accuracy which is performed from the upper surface 5b side of the sealing resin 5a, it is possible to prevent exposure of the bonding wires 4 and connecting terminals 15 from the cut faces 48 resulting from the dicing of step S8 and hence possible to improve the reliability and manufacturing yield of the semiconductor device.

In this embodiment, side faces 5c of the sealing resin 5 in each semiconductor device 1 manufactured are defined (formed) by side faces (i.e., cut faces formed by the dicing blade 37 in step S6) of the grooves 38 formed in the half-dicing step S6. As described above, since the accuracy of the dicing position in the half-dicing step S6 is high, it is possible to prevent exposure of the connecting terminals 15 and bonding wires 4 from the side faces 5c of the sealing resin 5 in each semiconductor device 1 manufactured. Moreover, since the accuracy of the dicing position in the half-dicing step S6 is high as noted above, it is possible to reduce the margin of the dicing regions 32c, which is advantageous to the reduction in size of the semiconductor device. Therefore, if this embodiment is applied, for example, to a CSP type semiconductor device as a small-sized semiconductor package of the chip size or a little larger than the semiconductor chip 2, there is obtained a more outstanding effect. For example, if this embodiment is applied to the case where the difference in planar position between an end portion of the semiconductor package 2 and an end portion of the wiring substrate 3 is not larger than about 0.5 mm, there is obtained a more outstanding effect.

In this embodiment it is preferable that the difference between the width W1 of the dicing blade 37 used in the half-dicing step S6 and the width W2 of the dicing blade 41 used in the dicing step S8 be different from each other (W1≠W2). As a result, it becomes possible to absorb mismatching (dislocation) between the dicing position in the half-dicing step in step S6 and the dicing position in the dicing step S8.

When the width W1 of the dicing blade 37 used in the half-dicing step S6 is larger than the width W2 of the dicing blade 41 used in the dicing step S8 (W1>W2), a stepped portion of the shape such that the lower portion of each side face 3c of the wiring substrate 3 projects outwards with respect to each side face 5c of the sealing resin 5 is formed in each side face of the semiconductor device manufactured. Even when the width W1 of the dicing blade 37 used in the half-dicing step S6 and the width W2 of the dicing blade 41 used in the dicing step S8 are equal to each other (W1=W2), if the dicing position in the half-dicing step S6 and that in the dicing step S8 are deviated from each other, there occurs a stepped portion in each side face of the semiconductor device manufactured. In one of both sides of each dicing region 32b there is formed a stepped portion of the shape such that the lower portion of the associated side face 3c of the wiring substrate projects outwards with respect to the associated side face 5c of the sealing resin 5. If in a side face of the semiconductor device manufactured there is formed a stepped portion of the shape such that the lower portion of the associated side face 3c of the wiring substrate 3 projects outwards with respect to the associated side face 5c of the sealing resin 5, there is the possibility that the following inconvenience may occur. The product size of each semiconductor device depends on an outline size of the sealing resin 5, so if in a side face of the semiconductor device there is formed a stepped portion of the shape such that the lower portion of the associated side face 3c of the wiring substrate projects outwards with respect to the associated side face 5c of the sealing resin 5, there is a fear of the semiconductor device being not received (incapable of being accommodated) within a socket or the like in for example a testing step which is conduced after the manufacture of the semiconductor device or there is a fear of the semiconductor device being not received (incapable of being accommodated) with a package receiving tray or the like in for example a conveyance step. The size of the socket and that of the tray are defined by JEDEC (Joint Electron Device Engineering Council) and they are formed in a size corresponding to the size on the sealing resin 5 side.

In this embodiment it is more preferable that the width W1 of the dicing blade 37 used in the half-dicing step S6 be smaller than the width W2 of the dicing blade 41 used in the dicing step S8 (S1<W2). As a result, in each side face 1c of the semiconductor device 1 manufactured, the associated side face 5c of the sealing resin 5 and the upper portion of the associated side face 3c of the wiring substrate 3c corresponds to a cut face (i.e., a side face of the groove 38) formed by the dicing blade 37 in the half-dicing step S6 and are flush with each other, but are dislocated from the lower portion 3d of the associated side face 3c of the wiring substrate 3 which is the cut face 48 formed by the dicing blade 41 in the dicing step S8. Consequently, in the side face 1c of the manufactured semiconductor device 1 shown in FIGS. 1 to 6, there is formed a stepped portion 20 of the shape such that the lower portion of the shape such that the lower portion 3d of the side face 3c of the wiring substrate 3 is recessed inwards with respect to the side face 5c of the sealing resin 5. That is, the stepped portion 20 is formed in the side face 1c of the semiconductor device 1 which is formed by both side face 5c of the sealing resin 5 and side face 5c of the wiring substrate 3, and the lower portion of the side face 5c of the semiconductor device is recessed with respect to the upper portion thereof. The stepped portion 20 in the side face 1c of the semiconductor device 1 is formed not in the side face of the sealing resin 5 but in the side face 3c of the wiring substrate 3 and the lower portion 3d of the side face 3c of the wiring substrate 3 is recessed with respect to the upper portion 3e of the side face 3c of the wiring substrate 3. Even if the dicing position in the half-dicing step S6 and that in the dicing step S8 are deviated from each other, the stepped portion 20 of the shape such that the lower portion 3d of the side face 3c of the wiring substrate 3 is recessed inwards with respect to the side face 5c of the sealing resin 5 is formed in the side face 1c of the semiconductor device 1 manufactured. Therefore, the foregoing stepped portion of the shape such that the lower portion of the side face 3c of the wiring substrate 3 projects outwards with respect to the side face 5c of the sealing resin 5 can be prevented from being formed in the side face of the semiconductor device and it is possible to stabilize the shape of the lower portion of each side face 1c of the semiconductor device manufactured. Thus, in this embodiment, the product size of the semiconductor device 1 is determined by an outline size of the sealing resin 5 and in each side face of the semiconductor device 1 there is formed the stepped portion 20 of the shape such that the lower portion 3d of the side face 3c of the wiring substrate 3 is recessed inwards with respect to the side face 5c of the sealing resin 5. Consequently, it becomes possible to accommodate the semiconductor device 1 accurately within a socket or a package receiving tray for example in a testing or conveying step which follows the manufacture of the semiconductor device 1. As a result, it is possible to further improve the semiconductor device manufacturing yield and enhance the easiness of handling of the semiconductor device.

Thus, it is preferable that the semiconductor device 1 have the stepped portion 20 in its side face 1c which is formed by both side face 5c of the sealing resin 5 and side face 3c of the wiring substrate 3 and that the lower portion of the side face 5c of the semiconductor device 1 be recessed with respect to the upper portion thereof. It is more preferable that the stepped portion 20 in the side face 1c of the semiconductor device 1 be formed not in the side face 5c but in the side face 3c of the wiring substrate 3 and that the lower portion 3d of the side face 3c of the wiring substrate be recessed with respect to the upper portion 3e of the side face 3c, with no stepped portion 30 formed in the side face 5c of the sealing resin 5. As a result, the semiconductor device 1 can be received (accommodated) accurately within a socket or a tray in a testing or conveying step which follows the manufacture of the semiconductor device 1. Thus, the testing step and the conveying step can be carried out with greater ease and accuracy.

Second Embodiment

Figure 32:
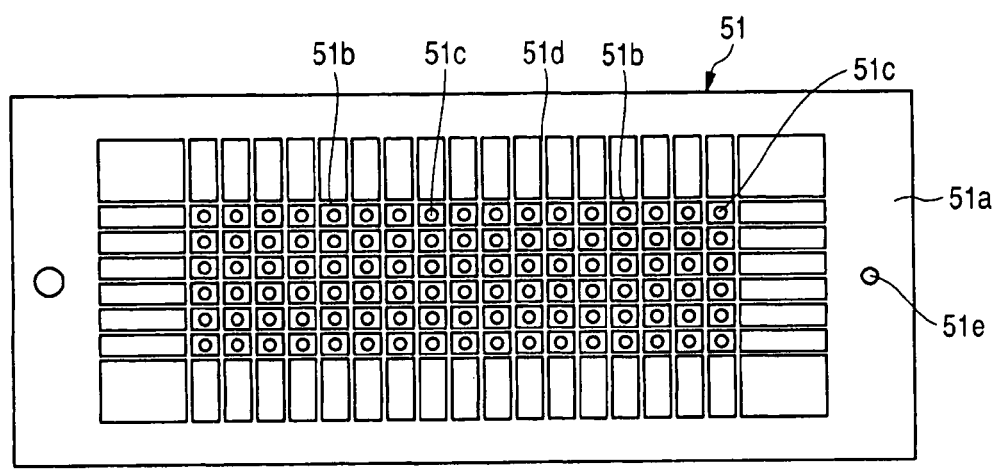
FIG. 32 is a plan view showing an example of structure of a substrate holding jig used in a manufacturing process for a semiconductor device according to another embodiment of the present invention.
Figure 33:
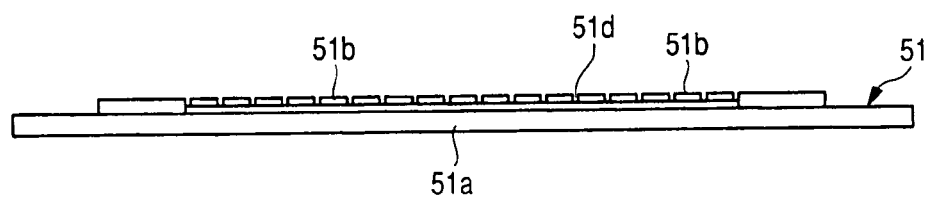
FIG. 33 is a side view showing the structure of the substrate holding jig shown in FIG. 32.
Figure 34:
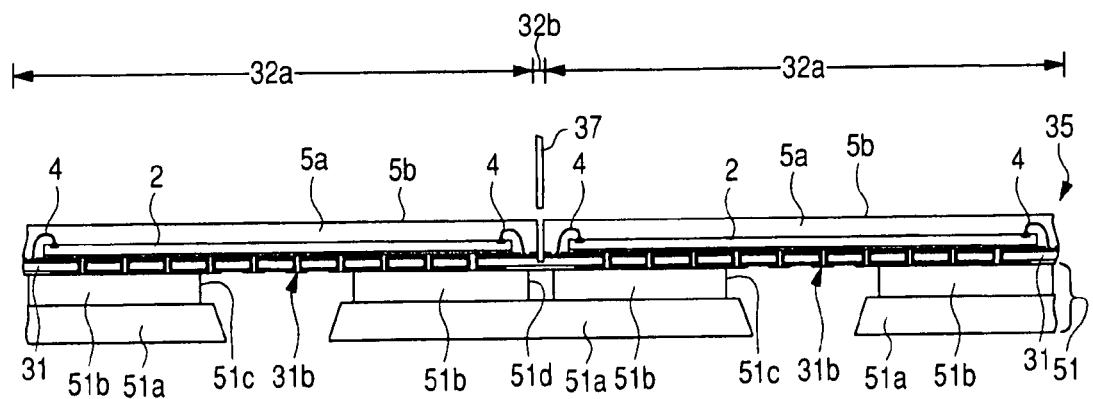
FIG. 34 is a sectional view of a principal portion in the manufacturing process of the semiconductor device according to another embodiment of the present invention.
Figure 37:
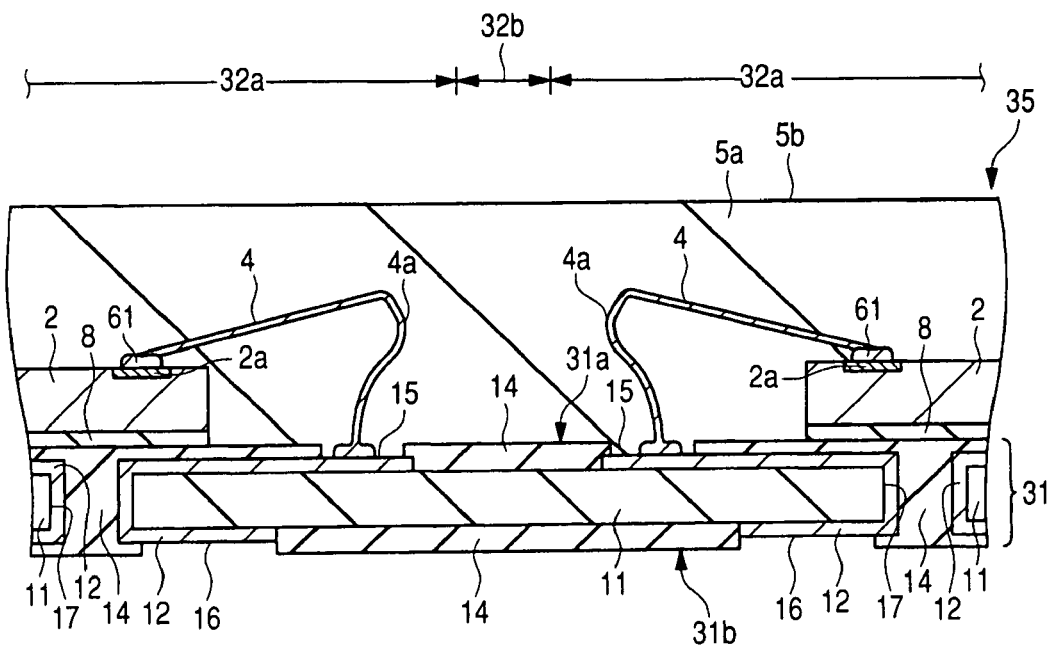
FIG. 37 is a sectional view of a principal portion in the manufacturing process of the semiconductor device which follows FIG. 36.

FIG. 32 is a plan view showing a structural example of a substrate holding jig 51 used in a semiconductor device manufacturing process according to a second embodiment of the present invention and FIG. 33 is a side view thereof. FIGS. 34 and 35 are sectional views of a principal portion in the manufacturing process of the semiconductor device according to this embodiment, corresponding to FIGS. 21 and 25, respectively, in the previous first embodiment.

The semiconductor device manufacturing process according to this embodiment is almost the same as the previous first embodiment except the half-dicing step S6 and the dicing step S8, therefore, an explanation of the portion common to the first embodiment will here be omitted and an explanation will be given about the half-dicing step S6 and the dicing step S8 in the semiconductor device manufacturing process according to this embodiment. The semiconductor device manufactured in accordance with the semiconductor device manufacturing process of this embodiment has almost the same structure as that of the semiconductor device of the first embodiment shown in FIGS. 1 to 7 and therefore an explanation thereof will here be omitted.

In the previous first embodiment the sealing body 35 is fixed using the package fixing tapes 39 and 42 which are sheet—or tape-like fixing jigs in the half-dicing step S6 and the dicing step S8, while in this second embodiment the sealing body 35 is fixed using a substrate holding jig 51 which is a plate-like fixing jig.

A description will be given first about the substrate holding jig 51 shown in FIGS. 32 and 33.

As shown in FIGS. 32 and 33, the substrate holding jig 51 is made up of a plate-like jig body 51a and product support portions 51b formed of rubber or the like to support the sealing body 35. Grooves 51d are formed in the product support portions 51b latticewise in correspondence to the dicing lines (dicing regions 32b) used in the dicing step.

Chucking holes (through holes) 51c are formed respectively in square regions (corresponding respectively to semiconductor device regions 32a) which are defined by the grooves 51d in the product support portions 51b. Further, a positioning hole 51e is formed in the jig body 51a at a position outside the product support portions 51b. In the dicing step, positioning of the substrate holding jig 51 can be done using the positioning hole 51e.

The half-dicing step S6 and the dicing step S8 are performed while fixing the wiring substrate 31 (sealing body 35) with use of the substrate holding jig 51.

More specifically, in the half-dicing step S6 according to this embodiment, as shown in FIG. 34, the lower surface 31b of the wiring substrate 31 is attracted through the chucking holes 51c of the substrate holding jig 51 and is thereby brought into close contact (attracted to) the product support portions 51b to fix the sealing body 35. Thereafter, half-dicing (forming grooves 38) of the sealing body 35 is performed using the dicing blade 37. Then, in the dicing step S8 according to this embodiment, as shown in FIG. 35, the upper surface 5b of the sealing resin 5a is attracted through the chucking holes 51c of the substrate holding jig 51 and is thereby brought into close contact (attracted to) the product support portions 51b to fix the sealing body 35. Subsequently, dicing of the sealing body 35 is performed using the dicing blade 41.

Explanations of the half-dicing step S6 and dicing step S8 will here be omitted because both steps are almost the same as in the first embodiment.

Also in this second embodiment there can be obtained approximately the same effects as in the first embodiment. However, in case of using the substrate holding jig 51, the sealing body 35 may undergo displacement during dicing if the chucking force induced by attraction is weak. In view of this point it is better to fix the sealing body 35 by the package fixing tapes 39 and 42 as in the first embodiment, whereby the sealing body 35 can be fixed more strongly and positively. Consequently, the sealing body 35 can be prevented more exactly in the half-dicing step S6 and the dicing step S8 and hence it is possible to further enhance the accuracy of the dicing position.

Third Embodiment

FIGS. 36 to 40 are sectional views of a principal portion in the semiconductor device manufacturing process according to this third embodiment. FIGS. 36, 37, 38, 39, and 40, correspond to FIG. 17 in the first embodiment, FIG. 19 in the first embodiment, FIG. 22 in the first embodiment, FIG. 26 in the first embodiment, and FIG. 28 in the first embodiment, respectively.

Also in this third embodiment the steps up to FIGS. 14 and 15 are the same as in the first embodiment and therefore explanations thereof will here be omitted. A description will be given below about the steps which follow FIG. 15.

After the structure of FIG. 15 is obtained by performing the step S1 of providing the wiring substrate 31 and the die bonding step S2, the wire bonding step S3 is performed to connect the electrodes 2a of the semiconductor chip 2 and the corresponding connecting terminals 15 formed on the wiring substrate 31 with each other electrically through bonding wires 4. According to the first embodiment, in the wire bonding step S3, first one ends of the bonding wires 4 are connected (first bonding) to the electrodes 2a of the semiconductor chip 2 and thereafter the other ends of the bonding wires 4 are connected (second bonding) to the connecting terminals 15 on the wiring substrate 31. On the other hand, in the wiring bonding step S3 according to this embodiment, first one ends of the bonding wires are connected (first bonding) to the connecting terminals 15 on the wiring substrate 31 and then the opposite ends of the bonding wires 4 are connected (second bonding) to the electrodes 2a of the semiconductor chip 2.

For example, the tip of a bonding wire 4 held by a capillary (not shown) of a wire bonding device is pushed against and connected to the surface of a connecting terminal 15 on the wiring substrate 31 under the application of an ultrasonic wave, then the capillary is pulled upward and is then moved laterally. Then, the bonding wire 4 is rubbed against and connected to the surface of an electrode 2a of the semiconductor chip 2 under the application of an ultrasonic wave, followed by cutting of the bonding wire 4. In this way the connecting terminal 15 on the wiring substrate 31 and the electrode 2a on the semiconductor chip 2 can be connected together electrically through the bonding wire 4.

More preferably, as shown in FIG. 36, a stud bump (bump electrode, bump) 61 formed of gold (Au) for example is formed on each electrode 2a of the semiconductor chip 2 and, at the time of second bonding, a bonding wire 4 is connected to the stud bump 61 on the electrode 2a. By so doing, it is possible to improve the connection strength between the bonding wire 4 and the electrode 2a of the semiconductor chip 2. Further, it is possible to diminish stress which is imposed on the semiconductor chip 2 at the time of second bonding to the electrode 2a of the semiconductor chip 2.

After the wire bonding step S3, the molding step S5 (the step of forming sealing resin 5a) is performed as in the first embodiment to form sealing resin 5a on the upper surface 31a of the wiring substrate 31. Thereafter, the marking step S5 is performed as in the first embodiment.

Figure 38:
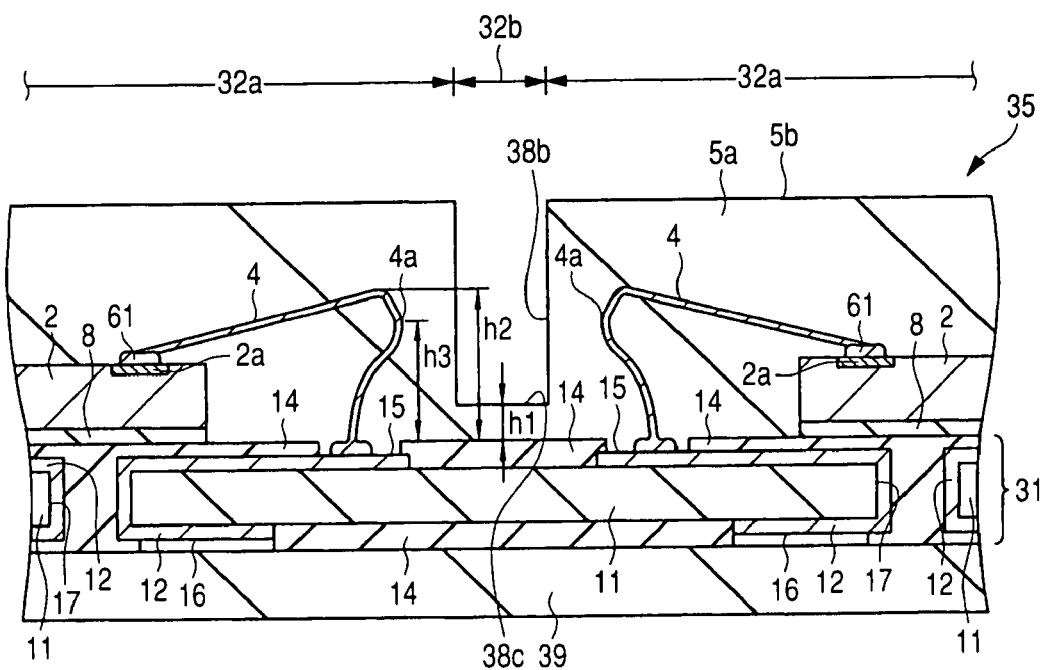
FIG. 38 is a sectional view of a principal portion in the manufacturing process of the semiconductor device which follows FIG. 37.

Next, there is performed a step corresponding to the half-dicing step S6 in the first embodiment. More specifically, as shown in FIG. 38, half-dicing is performed from the upper surface 3a side of the wiring substrate 3, namely, from the upper surface 5b side of the sealing resin 5a, along the dicing regions (dicing lines) 32b to form grooves (slits) 38b (corresponding to the grooves 38 in the first embodiment) in the sealing body 35. In the first embodiment it is preferable that the grooves 38 (the bottoms 38a thereof) formed in the sealing body 35 in the half-dicing step S6 reach the wiring substrate 31, but in this third embodiment the grooves 38b (bottoms 38c thereof) formed in the sealing body 35 in the half-dicing step S6 may fail to reach the wiring substrate 3 and the sealing resin 5a may remain under the bottoms 38c of the grooves 38b.

Then, in the same way as in the first embodiment, the step S7 of connecting the solder balls 6 is performed to connect the solder balls 6 to the lands formed on the lower surface 31b of the wiring substrate 31.

Figure 39:
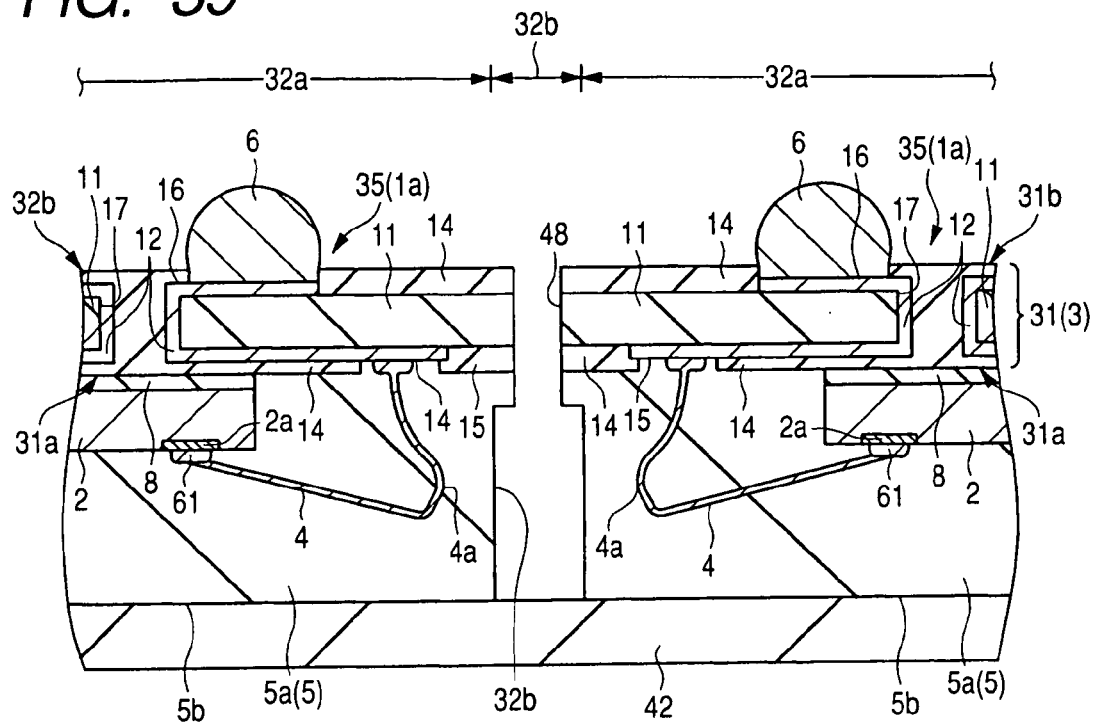
FIG. 39 is a sectional view of a principal portion in the manufacturing process of the semiconductor device which follows FIG. 38.
Figure 40:
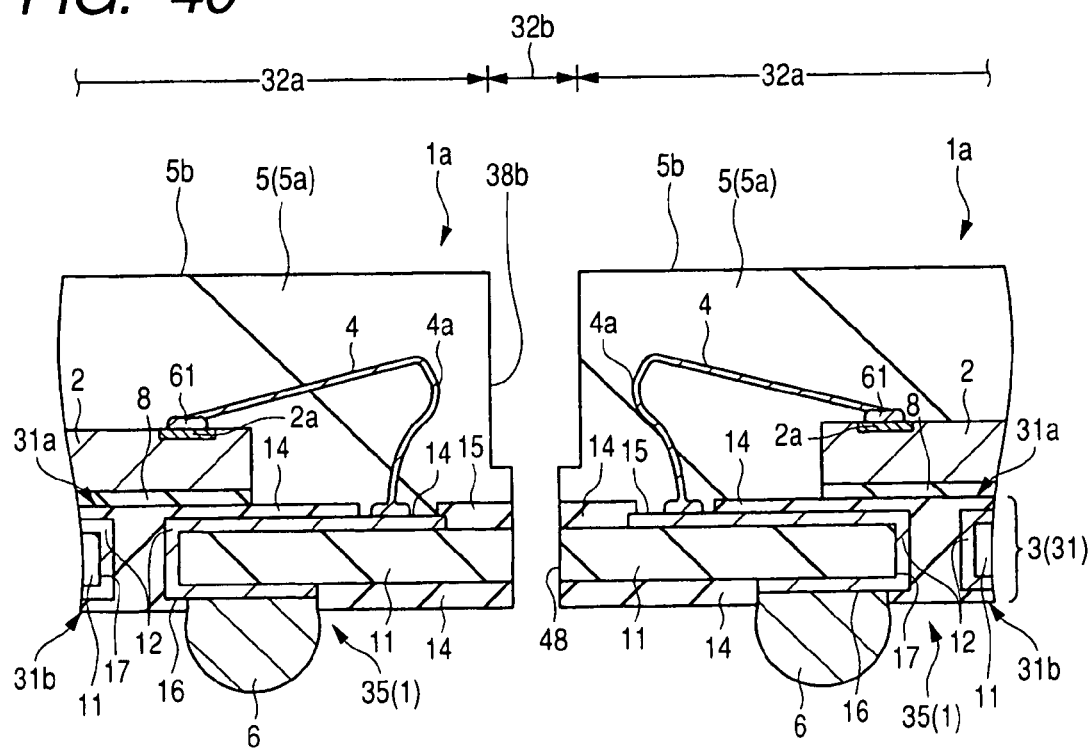
FIG. 40 is a sectional view of a principal portion in the manufacturing process of the semiconductor device which follows FIG. 39.

Next, there is performed a step corresponding to the dicing step S8 in the first embodiment. More specifically, as shown in FIG. 39, using a dicing blade (not shown) or the like, dicing is performed from the lower surface 31b side of the wiring substrate 31 and along the dicing regions (dicing lines) 32b each between adjacent semiconductor device regions 32a to cut the sealing body 35. As a result, as shown in FIG. 40, the sealing body 35 is cut completely along the dicing regions 32b and the semiconductor device regions 32a are divided into individual semiconductor devices 1a (corresponding to the individual semiconductor devices 1 in the first embodiment).

In the first embodiment first one ends of the bonding wires 4 are connected (first bonding) to the electrodes 2a of the semiconductor chip 2 and then the other ends of the bonding wires 4 are connected (second bonding) to the connecting terminals 15 on the wiring substrate 31. Therefore, in each of the bonding wires 4 thus connected, the portion thereof connected to the corresponding terminal 15 is the closest to the dicing region 32b concerned.

In the first embodiment, therefore, if each groove 38 does not reach the wiring substrate 31 (if it stops in the sealing resins 5a), the cut face 48 formed by dicing in step S8 reaches the sealing resin 5a. In this case, if the sealing body 35 is cut up to the sealing resin 5a from the lower surface 31b side of the wiring substrate 31 in the dicing step S8 which is lower in positional accuracy than the half-dicing step S6 performed from the upper surface 5b side of the sealing resin 5a, there is the possibility that the bonding wires 4 may be exposed from the cut surface 48 formed by dicing in step S8, with consequent deterioration in both reliability and manufacturing yield of the semiconductor device.

In view of this point, in the first embodiment the half-dicing step S6 is carried out so that the grooves 38 formed therein reach the wiring substrate 31. As a result, in the dicing step S8 performed from the lower surface 31b side of the wiring substrate 31 and which is lower in positional accuracy than the half-dicing step S6 performed from the upper surface 5b side of the sealing resin 5a, it suffices to cut only the wiring substrate 31 without cutting the sealing resin 5a and the cut face 48 formed by dicing in step S8 is formed in only the wiring substrate 31 without reaching the sealing resin 5a. Since each side face 5a of the sealing resin 5 and the upper portion 3e of each side face 3c of the wiring substrate 3 are defined (formed) by the cut face formed in the half-dicing step S6 of a high positional accuracy which is carried out from the upper surface 5b side of the sealing resin 5a, it is possible to prevent exposure of the bonding wires 4 from each cut face formed by dicing in step S8 and hence possible to improve the reliability and manufacturing yield of the semiconductor device.

On the other hand, in the wire bonding step S3 according to this third embodiment, first one ends of the bonding wires 4 are connected (first bonding) to the connecting terminals on the wiring substrate 31 and then the other ends of the bonding wires 4 are connected (second bonding) to the electrodes 2a of the semiconductor chip 2. Consequently, in each bonding wire 4 thus connected, a position 4a close to the top of a wire loop is the closest to the dicing region 32b concerned. That is, the position 4a of the bonding wire 4 corresponds to the bonding wire position closest to the dicing region 32b concerned. This position 4a is a bonding wire portion most likely to be exposed from the associated side face 5c of the sealing resin 5. In the semiconductor device 1a manufactured, the position 4a of the bonding wire 4 corresponds to a bonding wire position closest to the associated side face 5c of the sealing resin 5.

Therefore, in this embodiment, it suffices if the height (height position) $h_1$ of the bottom 38c of each groove 38 formed in the half-dicing step S6 is lower than the height (height position) $h_3$ of the position 4a of the bonding wire 4 ($h_1 < h_3$). That is, the bottom 38c of each groove 38b formed in the half-dicing step S6 may stop in the sealing resin 5a without reaching the wiring substrate 31 if only the height $h_1$ of the bottom 38c of each groove 38b is lower than the height $h_3$ of the position 4a of the bonding wire 4. Accordingly, in the case where first one end of each bonding wire 4 is connected to the corresponding connecting terminal 15 on the wiring substrate 31 and thereafter the other end of the bonding wire 4 is connected to the corresponding electrode 2a of the semiconductor chip 2 in the wire bonding step S2, the height (height position) $h_1$ of the bottom 38c of each groove 38 formed in the sealing body 35 in step S6 is made lower than at least the height (height position) $h_2$ of the wire loop of the bonding wire 4 ($h_1 < h_2$).

By the height (height position) $h_1$ of the bottom 38c of each groove 38b, the height (height position) $h_2$ of the wire loop of each bonding wire 4 and the height (height position) $h_3$ of the position 4a of each bonding wire 4 are meant the height (distance) from the upper surface 31a of the wiring substrate 31. Those heights each correspond to the height (distance) from the upper surface 31a of the wiring substrate 31 in a direction perpendicular to the upper surface 31a and the side close to the upper surface 31a is designated low, while the side far from the upper surface 31a is designated high. The height (height position) $h_2$ of the wire loop of each bonding wire 4 corresponds to the height of the top (the highest bonding wire position from the upper surface 31a of the wiring substrate 31) of the wire loop from the upper surface 31a of the wiring substrate 31. As in this embodiment, when first one ends of the bonding wires 4 are connected to the connecting terminals 15 on the wiring substrate 31 and then the other ends thereof are connected to the electrodes 2a of the semiconductor chip 2, the height $h_2$ of the wire loop of each bonding wire 4 and the height $h_3$ of the position 4a of the bonding wire are almost equal to each other (h2≈h3).

In this embodiment, the height $h_1$ of the bottom 38c of each groove 38b formed in the half-dicing step S6 is made lower than at least the height $h_2$ of the wire loop of each bonding wire ($h_1 < h_2$). Further, it is made lower than the height h3 of the position 4a of each bonding wire 4 ($h_1 < h_3$). Therefore, the side face (cut face) of the sealing resin 5 in the region corresponding to the bonding wire position 4a most likely to be exposed from the side face 5c of the sealing resin 5 is defined (formed) by the cut face (i.e., the side face of each groove 38b) in the half-dicing step S6 of a high positional accuracy which is performed from the upper surface 5b side of the sealing resin 5a. As a result, it is possible to prevent exposure of each bonding wire 4 from the cut face of the sealing resin 5a formed by dicing and hence possible to improve the reliability and manufacturing yield of the semiconductor device.

Also in this embodiment, as in the first embodiment, the grooves 38b formed in the half-dicing step S6 can be allowed to reach the wiring substrate 31. In this case, not only it is possible to prevent exposure of the bonding wires 4 from each side face 5c of the sealing resin 4, but also it is possible to positively prevent exposure of the terminals 15 from each side face 1c of the semiconductor device 1.

Although the present invention has been described above concretely by way of embodiments thereof, it goes without saying that the present invention is not limited to the above embodiments, but that various changes may be made within the scope not departing from the gist of the invention.

The present invention is effectively applicable to a semiconductor device of a semiconductor package type with a semiconductor chip mounted on a wiring substrate, as well as a method of manufacturing the semiconductor device.

What is claimed is:

1. A method of manufacturing a semiconductor device, comprising the steps of:
    (a) providing a wiring substrate having a plurality of unit substrate regions from which semiconductor devices are to be manufactured respectively, the wiring substrate having a first main surface and a second main surface located on the side opposite to the first main surface, with a plurality of first electrodes being formed over the first main surface of each of the unit substrate regions and a plurality of land portions formed over the second main surface of each of the unit substrate regions;
    (b) mounting semiconductor chips over the unit substrate regions respectively over the first main surface of the wiring substrate and coupling a plurality of second electrodes of the semiconductor chips electrically to the first electrodes of the wiring substrate;
    (c) forming a sealing resin over the unit substrate regions over the first main surface of the wiring substrate so as to cover the semiconductor chips, thereby forming a sealing body comprising the wiring substrate and the sealing resin;
    (d) cutting the sealing body with a dicing blade along the dicing regions between the unit substrate regions from the first main surface side of the wiring substrate such that the dicing blade reaches a part of the wiring substrate;
    (e) after the step (d), forming external connecting terminals over the land portions respectively in the unit substrate regions over the second main surface of the wiring substrate; and
    (f) after the step (e), cutting the wiring substrate with another dicing blade along the dicing regions from the second main surface side of the wiring substrate such that the another dicing blade reaches the part of the wiring substrate.

2. The method of manufacturing the semiconductor device according to claim 1, wherein the width of the dicing blade used in the step (d) is wider than the width of the another dicing blade used in the step (f).

* * * * *